United States Patent
Hangai et al.

(10) Patent No.: US 8,618,878 B2
(45) Date of Patent: Dec. 31, 2013

(54) MULTIPORT AMPLIFIER AND WIRELESS DEVICE USING THE SAME

(75) Inventors: Masatake Hangai, Tokyo (JP); Kazutomi Mori, Tokyo (JP); Kenichi Tajima, Tokyo (JP); Yukihiro Tahara, Tokyo (JP); Morishige Hieda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 181 days.

(21) Appl. No.: 13/142,542

(22) PCT Filed: Oct. 1, 2009

(86) PCT No.: PCT/JP2009/067166
§ 371 (c)(1),
(2), (4) Date: Jun. 28, 2011

(87) PCT Pub. No.: WO2010/079644
PCT Pub. Date: Jul. 15, 2010

(65) Prior Publication Data
US 2011/0267141 A1    Nov. 3, 2011

(30) Foreign Application Priority Data

Jan. 9, 2009   (JP) ................................ 2009-003568
Apr. 28, 2009  (WO) .................. PCT/JP2009/058371

(51) Int. Cl.
*H03F 3/68*  (2006.01)
(52) U.S. Cl.
USPC .......................... 330/84; 330/124 R; 330/295
(58) Field of Classification Search
USPC ........................ 330/84, 124 R, 109, 107, 295; 455/127.2
See application file for complete search history.

(56) References Cited

U.S. PATENT DOCUMENTS

| 4,398,161 | A | * | 8/1983 | Lamb et al. .................. 333/156 |
| 5,764,104 | A | | 6/1998 | Luz |
| 6,294,956 | B1 | | 9/2001 | Ghanadan et al. |
| 6,661,284 | B1 | | 12/2003 | Luz et al. |

(Continued)

FOREIGN PATENT DOCUMENTS

| JP | 64 022103 | 1/1989 |
| JP | 2000 511371 | 8/2000 |

(Continued)

OTHER PUBLICATIONS

International Search Report issued Dec. 28, 2009 in PCT/JP09/67166 filed Oct. 1, 2009.

*Primary Examiner* — Patricia Nguyen
(74) *Attorney, Agent, or Firm* — Oblon, Spivak, McClelland, Maier & Neustadt, L.L.P.

(57) ABSTRACT

A multiport amplifier and a wireless device using the same are obtained in which isolation among output terminals is improved, whereby the quality of communication is improved. The multiport amplifier includes an input hybrid, an output hybrid, a plurality of amplifiers and a plurality of gain and phase control circuits that are inserted between the input hybrid and the output hybrid, a plurality of output coupling circuits that are inserted between the output hybrid and a plurality of output terminals so that they receive output extraction signals corresponding to a plurality of output signals, and a feedback circuit including a frequency selection circuit that is inserted between the plurality of output coupling circuits and the plurality of gain and phase control circuits.

6 Claims, 16 Drawing Sheets

(56) References Cited

U.S. PATENT DOCUMENTS

| | | |
|---|---|---|
| 7,965,136 B2 * | 6/2011 | Rhodes et al. .................... 330/2 |
| 8,004,356 B2 * | 8/2011 | Couchman et al. ........ 330/124 D |
| 8,103,225 B2 * | 1/2012 | Couchman et al. ........ 455/127.1 |
| 2004/0222849 A1 | 11/2004 | Doi |
| 2009/0082691 A1 * | 3/2009 | Denison et al. ............... 600/544 |
| 2010/0271121 A1 * | 10/2010 | Jones et al. ............... 330/124 D |
| 2013/0057341 A1 * | 3/2013 | Sobukawa .................... 330/100 |

FOREIGN PATENT DOCUMENTS

| | | |
|---|---|---|
| JP | 2001 185958 | 7/2001 |
| JP | 2002 208874 | 7/2002 |
| JP | 2004 336448 | 11/2004 |
| JP | 2005 86527 | 3/2005 |
| JP | 2005 520454 | 7/2005 |
| JP | 2005 269043 | 9/2005 |

* cited by examiner

MULTIPORT AMPLIFIER AND WIRELESS DEVICE USING THE SAME

TECHNICAL FIELD

The present invention relates to a multiport amplifier having an error compensation circuit, and to a wireless device using the same.

BACKGROUND ART

A multiport amplifier is provided with an input hybrid, an output hybrid, and a plurality of amplifiers connected between them, wherein input signals having different frequency components are inputted to a plurality of input terminals of the input hybrid, and are distributed, amplified and combined, and output signals having frequency components different from those of the above-mentioned input signals are outputted from a plurality of output terminals of the output hybrid. As a result of this, the individual amplifiers are of an arrangement to amplify all the different frequency components, and hence, it is possible to decrease the deterioration of communication quality at the time of the failure of the amplifiers, as compared with an arrangement in which an amplifier is provided for each of the frequency components.

Conventionally, there has been proposed a hybrid matrix amplification system (multiport amplifier) which serves to compensate for a gain error and a phase error (for example, see a first patent document).

FIG. 15 and FIG. 16 are circuit block diagrams showing a multiport amplifier which is described in the first patent document.

In FIG. 15, signals that have been extracted by couplers 355 through 358 are combined into a composite signal by means of a combiner 390, and in FIG. 16, signals that have been extracted by couplers 381 through 384 are combined into a composite signal by means of a combiner 396. As a result of this, in a feedback circuit 303, control signals for compensating for the gain error and the phase error of the amplifiers 350 through 353 or the amplifiers 375 through 378 are obtained based on the composite signals.

However, if the multiport amplifier is constructed as shown in FIG. 15 and FIG. 16, there will be a possibility that a signal of a small amplitude can not be received with a high degree of accuracy due to the limitation of the dynamic range of the reception sensitivity of circuits (RF reception units 391, 397) which receive the composite signals.

PRIOR ART REFERENCES

Patent Documents

First Patent Document: Japanese patent No. 3880993

SUMMARY OF THE INVENTION

Problems to be Solved by the Invention

With the conventional multiport amplifier, a signal with a small amplitude can not be received with sufficient accuracy due to the limitation of the dynamic range of the reception sensitivity of the circuits which receive composite signals, so there has been a problem that appropriate control signals for error compensation can not be obtained.

The present invention has been made in order to solve the problem as referred to above, and has for its object to obtain a multiport amplifier and a wireless device using the same in which an amplitude difference and a phase difference among output signals from individual amplifiers can be reduced to remove unnecessary frequency components included in each of the output signals, whereby isolation between output terminals can be improved to thereby enhance the quality of communication.

Means for Solving the Problems

A multiport amplifier according to the present invention includes an input hybrid to which a plurality of input signals corresponding to a plurality of channels are inputted, an output hybrid which outputs a plurality of output signals corresponding to the plurality of input signals from a plurality of output terminals, and a plurality of amplifiers and a plurality of gain and phase control circuits which are inserted between the input hybrid and the output hybrid, wherein the plurality of amplifiers are combined in parallel with one another. The multiport amplifier is provided with a plurality of output coupling circuits that are inserted between the output hybrid and the plurality of output terminals so that they receive output extraction signals corresponding to the plurality of output signals, and a feedback circuit that is inserted between the plurality of output coupling circuits and the plurality of gain and phase control circuits, wherein the feedback circuit includes at least one frequency selection circuit.

Effect of the Invention

According to the present invention, an amplitude difference and a phase difference among output signals from individual amplifiers can be reduced to remove unnecessary frequency components included in each of the output signals, whereby isolation between output terminals can be improved, thus making it possible to enhance the quality of communication.

BEST MODES FOR CARRYING OUT THE INVENTION

First Embodiment

Hereinafter, preferred embodiments of the present invention will be explained while referring to the accompanying drawings.

Figure 1:
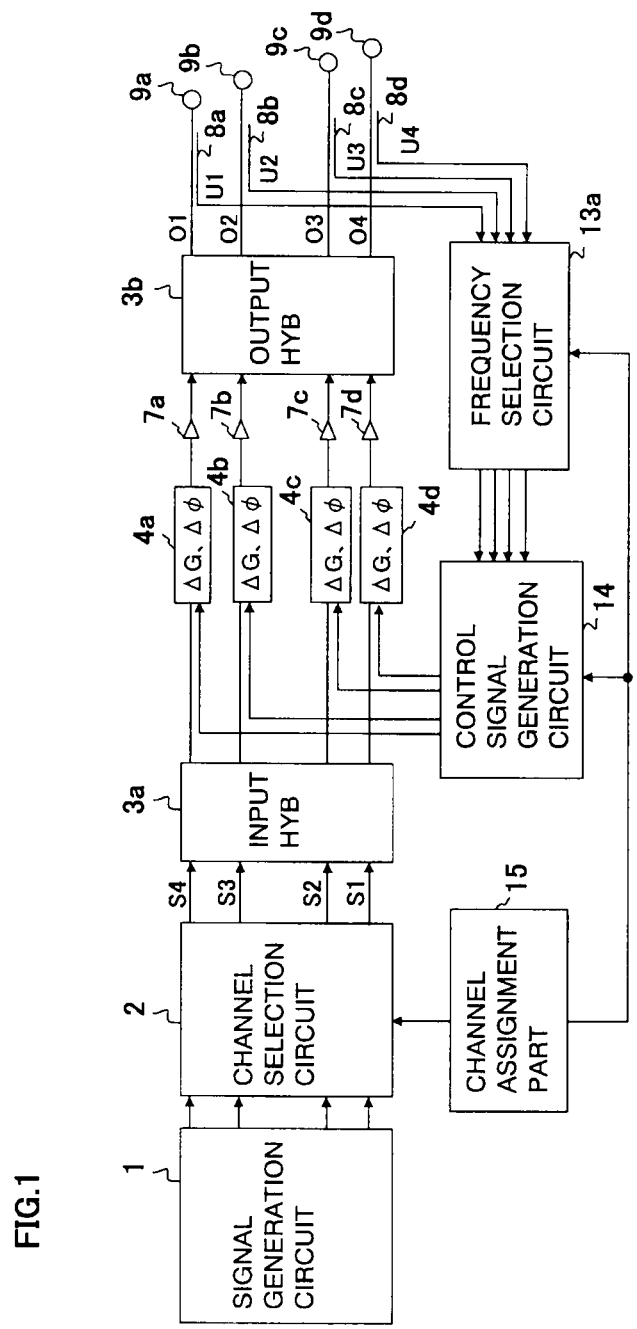
FIG. 1 is a block diagram showing the arrangement of a multiport amplifier according to a first embodiment of the present invention. (First Embodiment)

FIG. 1 is a block diagram showing the arrangement of a multiport amplifier according to a first embodiment of the present invention, wherein an example of the multiport amplifier having an error compensation circuit with the number of ports being four is shown.

In FIG. 1, the multiport amplifier is provided with a signal generation circuit 1, a channel selection circuit 2, an input hybrid (input HYB) 3a, an output hybrid (output HYB) 3b, gain and phase control circuits (ΔG, Δϕ) 4a through 4d, amplifiers 7a through 7d, output coupling circuits 8a through 8d, output terminals 9a through 9d, a frequency selection circuit 13a, a control signal generation circuit 14, and a channel assignment part 15, wherein it is constructed such that the plurality of amplifiers 7a through 7d are combined in parallel with one another.

A plurality of (here, "4 channels" as an example) input signals S1 through S4 generated from the signal generation circuit 1 are inputted to the input hybrid 3a through the channel selection circuit 2.

By passing through the input hybrid 3a, the input signals S1 through S4 corresponding to a plurality of channels are outputted with their port positions being inverted upside down.

The output hybrid 3b outputs a plurality of output signals O1 through O4 corresponding to the plurality of input signals S1 through S4 from the plurality of output terminals 9a through 9d.

The plurality of amplifiers 7a through 7d and the plurality of gain and phase control circuits 4a through 4d, which correspond to the individual channels, respectively, are inserted in series between the input hybrid 3a and the output hybrid 3b, respectively.

The plurality of output coupling circuits 8a through 8d are inserted between the output hybrid 3b and the plurality of output terminals 9a through 9d, respectively, so that they receive the output extraction signals U1 through U4 corresponding to the plurality of output signals O1 through O4, respectively.

The frequency selection circuit 13a and the control signal generation circuit 14 together constitute a feedback circuit, and are inserted between the plurality of output coupling circuits 8a through 8d and the plurality of gain and phase control circuits 4a through 4d.

The channel selection circuit 2, the frequency selection circuit 13a, and the control signal generation circuit 14 operate in response to a signal from the channel assignment part 15.

The control signal generation circuit 14, which constitutes a feedback circuit, is connected to the plurality of gain and phase control circuits 4a through 4d, and serves to generate control signals for attenuating unnecessary frequencies components in the output extraction signals U1 through U4 received through the plurality of output coupling circuits 8a through 8d, so that the control signals are inputted to the plurality of gain and phase control circuits 4a through 4d.

Here, note that in FIG. 1, the feedback circuit has the single frequency selection circuit 13a, but it may have two or more frequency selection circuits.

In addition, the frequency selection circuit 13a may be constituted by a band stop filter 21 (see FIG. 2), as will be described later.

Next, reference will be made to an operation according to this first embodiment of the present invention as shown in FIG. 1.

Based on a signal outputted from the channel assignment part 15, the signals generated in the signal generation circuit 1 are assigned with frequency components f1 through f4 for individual channels, respectively, in the channel selection circuit 2.

That is, the individual input signals S1 through S4 outputted from the channel selection circuit 2 correspond to the individual frequency components f1 through f4, respectively, wherein the input signal S1 has only the frequency component f1, the input signal S2 has only the frequency component f2, the input signal S3 has only the frequency component f3, and the input signal S4 has only the frequency component f4.

The input signals S1 through S4 are inputted to mutually different input terminals of the input hybrid 3a, respectively, so as to be distributed and combined therein. The signals thus distributed and combined in the input hybrid 3a are amplified in the amplifiers 7a through 7d, and thereafter are inputted to the output hybrid 3b, in which after being distributed and combined again, they are outputted from the output hybrid 3b as the output signals O1 through O4.

Here, if the amplifiers 7a through 7d are in ideal conditions in which they operate at an equal amplitude and an equal phase, the frequencies of the output signals O1 through O4 are similar to the input signals S1 through S4, such that the output signal O1 has only the frequency component f1, the output signal O2 has only the frequency component f2, the output signal O3 has only the frequency component f3, and the output signal O4 has only the frequency component f4, respectively.

Accordingly, only the frequency component f1 is outputted from the output terminal 9a, only the frequency component f2 is outputted from the output terminal 9b, only the frequency component f3 is outputted from the output terminal 9c, and only the frequency component f4 is outputted from the output terminal 9d, so that the output signals O1 through O4 do not mutually interfere with one another.

However, in general, the amplifiers 7a through 7d change in gain and phase in accordance with a variation, temperature change, aged deterioration, etc., of their circuits, so they do not operate at an equal amplitude and at an equal phase, thus giving rise to an error.

In this manner, if the feedback circuit arrangement of FIG. 1 is not applied when an error occurs in the amplitude and phase of the amplifiers 7a through 7d, not only the desired frequency component f1 but the unnecessary frequency components f2, f3, f4 will be included in the output signal O1 from the output hybrid 3b, for example.

Similarly, not only the desired frequency component f2 but also the unnecessary frequency components f1, f3, f4 are included in the output signal O2, and not only the desired frequency component f3 but also the unnecessary frequency components f1, f2, f4 are included in the output signal O3, and in addition, not only the desired frequency component f4 but also the unnecessary frequency components f1, f2, f3 are included in the output signal O4.

As a result, in cases where the amplifiers 7a through 7d do not operate at an equal amplitude and an equal phase, the isolation among the output terminals 9a through 9d deteriorates, and hence, the quality of communication also deteriorates.

Therefore, in order to solve this problem, the feedback circuit arrangement of FIG. 1 is applied. That is, the output coupling circuits 8a through 8d extract a part of the output signals O1 through O4, respectively, and input them to the frequency selection circuit 13a as the output extraction signals U1 through U4.

Only the frequency components f2 through f4 other than the frequency component f1 of the output extraction signal U1 inputted to the frequency selection circuit 13a pass therethrough, and are inputted to the control signal generation circuit 14.

Similarly, only the frequency components f1, f3, f4 other than the frequency component f2 of the output extraction signal U2 pass through the frequency selection circuit 13a, and are inputted to the control signal generation circuit 14, and only the frequency components f1, f2, f4 other than the frequency component f3 of the output extraction signal U3 pass through the frequency selection circuit 13a, and are inputted to the control signal generation circuit 14, and in addition, only the frequency components f1 through f3 other than the frequency component f4 of the output extraction signal U4 pass through the frequency selection circuit 13a, and are inputted to the control signal generation circuit 14.

Here, the passing frequencies in the frequency selection circuit 13a are decided based on a signal inputted thereto from the channel assignment part 15.

Subsequently, the control signal generation circuit 14 detects the input signals from the frequency selection circuit 13a, and inputs control signals to the gain and phase control circuits 4a through 4d, respectively, so that individual amplitude levels of the input signals thus detected become small.

As a result of this, the frequency components which have passed through the control signal generation circuit 14 are controlled in a feedback manner so as to be decreased, respectively.

At this time, the control signals from the control signal generation circuit 14 are generated based on the signals outputted from the frequency selection circuit 13a and the signal outputted from the channel assignment part 15.

In accordance with the above-mentioned feedback operation, the amplitude difference and the phase difference among the signals outputted from the amplifiers 7a through 7d are reduced in the multiport amplifier shown in FIG. 1, and the unnecessary frequency components included in each of the output signals O1 through O4 are removed.

As a result, the isolation among the output terminals 9a through 9d is improved, whereby the quality of communication is improved.

In addition, the control signals are generated by attenuating in advance the desired frequency components (being larger in amplitude as compared with unnecessary frequency components), and inputting them to the control signal generation circuit 14, so that a large dynamic range is not required for the reception sensitivity of the control signal generation circuit 14, thus making it possible to obtain the device in an easy manner.

Figure 2:
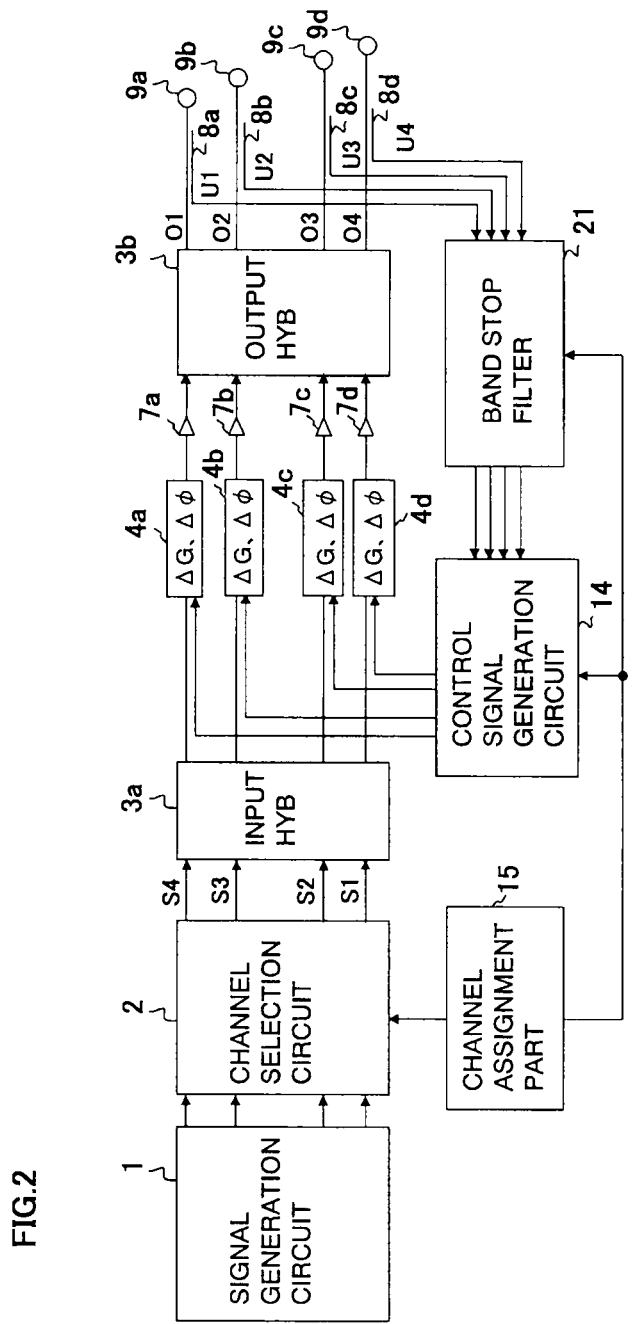
FIG. 2 is a block diagram showing another arrangement example of the multiport amplifier according to the first embodiment of the present invention. (First Embodiment)

Here, note that equivalent effects can be obtained even if the frequency selection circuit 13a in FIG. 1 is replaced by the band stop filter 21, as shown in FIG. 2.

In addition, here, the case where the gain and phase control circuits 4a through 4d and the amplifiers 7a through 7d are four ports, respectively, has been explained by way of example, but the number of ports can be set to an arbitrary plural number (i.e., equal to or greater than two).

As described above, according to the first embodiment (FIG. 1) of the present invention, in the multiport amplifier which is composed of the input hybrid 3a to which the plurality of input signals S1 through S4 corresponding to the plurality of channels are inputted, the output hybrid 3b which outputs the plurality of output signals O1 through O4 corresponding to the plurality of input signals S1 through S4 from the plurality of output terminals 9a through 9d, and the plurality of amplifiers 7a through 7d and the plurality of gain and phase control circuits 4a through 4d which are inserted between the input hybrid 3a and the output hybrid 3b, wherein the plurality of amplifiers 7a through 7d are combined in parallel with one another, provision is made for the plurality of output coupling circuits 8a through 8d that are inserted between the output hybrid 3b and the plurality of output terminals 9a through 9d so that they receive the output extraction signals U1 through U4 corresponding to the plurality of output signals O1 through O4, and the feedback circuit that is inserted between the plurality of output coupling circuits 8a through 8d and the plurality of gain and phase control circuits 4a through 4d.

The feedback circuit has at least one frequency selection circuit 13a, and the control signal generation circuit 14 that is connected to the plurality of gain and phase control circuits 4a through 4d.

The frequency selection circuit 13a can be constituted by the band stop filter 21 (see FIG. 2).

The control signal generation circuit 14 generates control signals for attenuating unnecessary frequencies components in the output extraction signals U1 through U4 received through the plurality of output coupling circuits 8a through 8d, and inputs the control signals thus generated to the plurality of gain and phase control circuits 4a through 4d.

Figure 3:
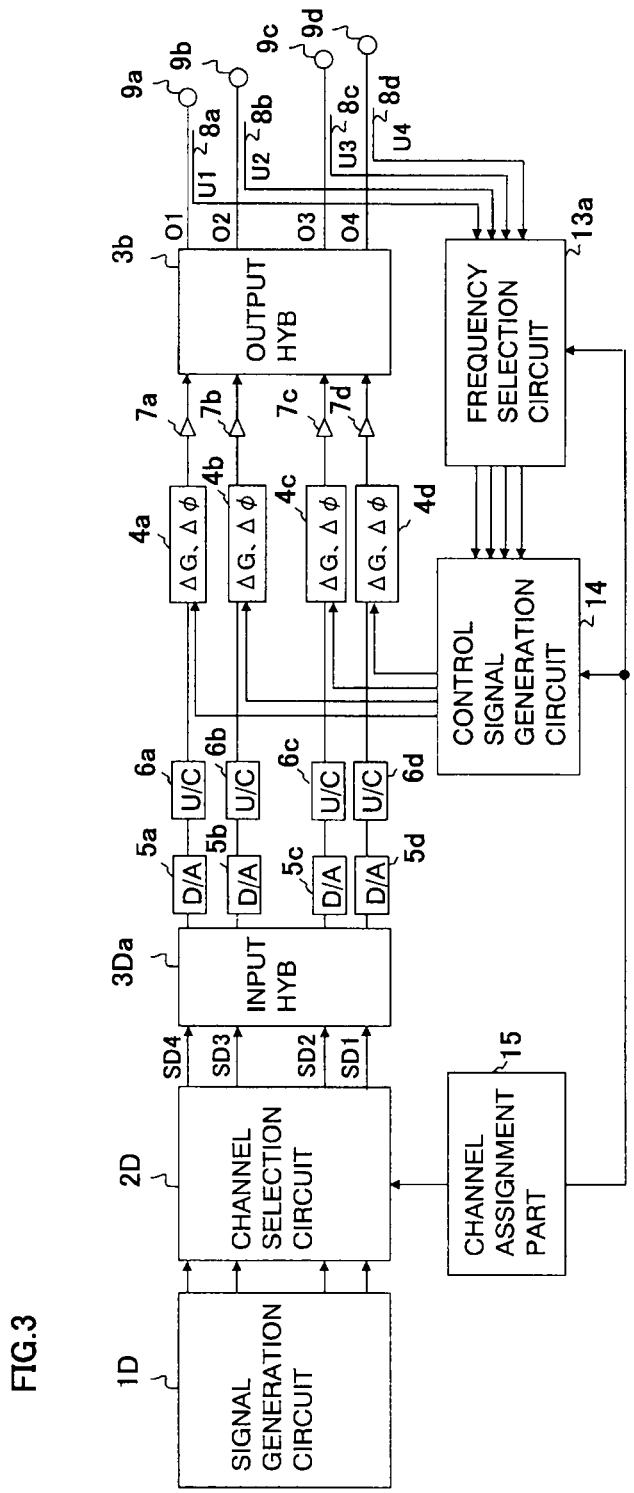
FIG. 3 is a block diagram showing the arrangement of a multiport amplifier according to a second embodiment of the present invention. (Second Embodiment)

Accordingly, the amplitude difference and the phase difference among the output signals from the individual amplifiers 7a through 7d can be reduced to remove unnecessary frequency components included in each of the output signals O1 through O4, whereby the isolation between the output terminals 9a through 9d can be improved to thereby enhance the quality of communication Second Embodiment Here, note that in the above-mentioned first embodiment (FIG. 1 and FIG. 2), the input hybrid 3a composed of an analog circuit is used, but an input hybrid 3Da composed of a digital circuit may be used, as shown in FIG. 3.

FIG. 3 is a block diagram showing a multiport amplifier according to a second embodiment of the present invention, wherein an arrangement thereof having an error compensation circuit with the number of ports being four is shown.

In FIG. 3, those components which are similar to the above-mentioned ones (see FIG. 1) are denoted by the same reference numerals and characters as those in the above-mentioned embodiment, or with "D" being attached to reference numerals, and a detailed description thereof is omitted.

In this case, the input hybrid 3Da is constituted by a digital circuit. In addition, a signal generation circuit 1D and a channel selection circuit 2D are also composed of digital circuits, respectively.

The signal generation circuit 1D generates a digital signal, and inputs it to the input hybrid 3Da as input signals SD1 through SD4 through the channel selection circuit 2D. In addition, between the input hybrid 3Da and the gain and phase control circuits 4a through 4d, DA converters 5a through 5d and up converters 6a through 6d are inserted in series with one another.

As compared with the above-mentioned multiport amplifier (FIG. 1), the arrangement of the multiport amplifier of FIG. 3 is different therefrom in that the input hybrid 3Da is composed of a digital circuit, and the input signals SD1 through SD4 are composed of digital signals, respectively.

Digital signals outputted from the input hybrid 3Da are converted into analog signals by means of the DA converters 5a through 5d, and are further converted into signals of RF frequencies by means of the up converters 6a through 6d.

The other operations of this second embodiment are the same as those of the above-mentioned first embodiment, and the effects obtained thereof are also equivalent to the above-mentioned ones.

As described above, in the multiport amplifier according to the second embodiment (FIG. 3) of the present invention, the input hybrid 3Da is composed of the digital circuit, and provision is made for the DA converters 5a through 5d and the up converters (frequency converters) 6a through 6d which are inserted in series with one another between the input hybrid 3Da and the gain and phase control circuits 4a through 4d.

According to this, the above-mentioned operational effects can be obtained, and at the same time, the reduction in size of circuitry can be attained, as compared with the case where the input hybrid 3a (FIG. 1) composed of the analog circuit is used.

In addition, it becomes possible to decrease a combining or coupling error and a distribution error, as a result of which the quality of communication can be improved.

Third Embodiment

Figure 4:
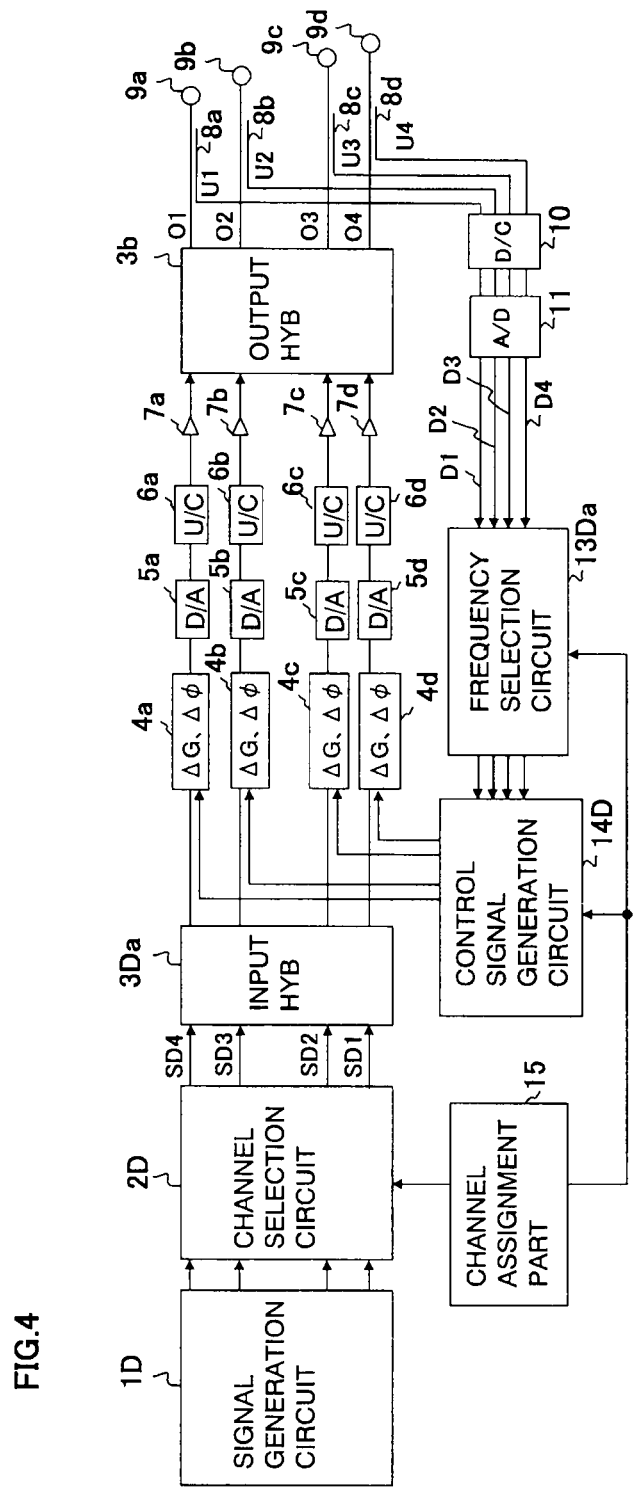
FIG. 4 is a block diagram showing a first arrangement example of a multiport amplifier according to a third embodiment of the present invention. (Third Embodiment)

Here, note that in the above-mentioned second embodiment (FIG. 3), only the input hybrid 3Da is composed of the digital circuit, but at least one of the input hybrid and the plurality of gain and phase control circuits can be composed of a digital circuit, and as shown in FIG. 4, not only the input hybrid 3Da but the gain and phase control circuits 4Da through 4Dd may be composed of digital circuits, respectively.

FIG. 4 is a block diagram showing a multiport amplifier according to a third embodiment of the present invention, wherein an arrangement thereof having an error compensation circuit with the number of ports being four is shown.

In FIG. 4, those components which are similar to the above-mentioned ones (see FIG. 3) are denoted by the same reference numerals and characters as those in the above-mentioned embodiment, or with "D" being attached to reference numerals, and a detailed description thereof is omitted.

In this case, not only the input hybrid 3Da but also the gain and phase control circuits 4Da through 4Dd are composed of digital circuits, respectively. In addition, a frequency selection circuit 13Da and a control signal generation circuit 14D are also composed of digital circuits, respectively.

In addition, the DA converters 5a through 5d and the up converters 6a through 6d are inserted in series with one another between the gain and phase control circuits 4Da through 4Dd and the amplifiers 7a through 7d.

Further, between the output coupling circuits 8a through 8d and the frequency selection circuit 13Da, a down converter (D/C) 10 and an AD converter (A/D) 11 are inserted in series with each other. That is, the feedback circuit has the down converter 10 (frequency converter) and the AD converter 11.

Next, reference will be made to an operation according to this third embodiment of the present invention as shown in FIG. 4.

Input signals SD1 through SD4, which are composed of digital signals generated in the signal generation circuit 1D, are assigned with frequency components f1 through f4, respectively, based on a signal outputted from the channel assignment part 15 in the channel selection circuit 2D.

In the relation between the frequency components f1 through f4 and the input signals SD1 through SD4 from the channel selection circuit 2D, the input signal SD1 has only the frequency component f1, the input signal SD2 has only the frequency component f2, the input signal SD3 has only the frequency component f3, and the input signal SD4 has only the frequency component f4.

The individual input signals SD1 through SD4 are inputted to mutually different input terminals of the input hybrid 3Da composed of a digital circuit, respectively, so as to be distributed and combined therein. Digital signals thus distributed and combined are converted into analog signals, respectively, by means of the DA converters 5a through 5d, and are further converted into signals of RF frequencies by means of the up converters 6a through 6d.

The signals thus converted into the signals of RF frequencies are amplified in the amplifiers 7a through 7d, respectively, and thereafter are inputted to the output hybrid 3b, in which they are distributed and combined again to provide output signals O1 through O4.

Here, if the amplifiers 7a through 7d are in ideal conditions in which they operate at an equal amplitude and an equal phase, as stated above, the output signal O1 has only the frequency component f1, the output signal O2 has only the frequency component f2, the output signal O3 has only the frequency component f3, and the output signal O4 has only the frequency component f4.

In this case, only the frequency component f1 is outputted from the output terminal 9a, only the frequency component f2 is outputted from the output terminal 9b, only the frequency component f3 is outputted from the output terminal 9c, and only the frequency component f4 is outputted from the output terminal 9d, so that the individual output signals do not mutually interfere with one another.

However, as stated above, the amplifiers 7a through 7d change in gain and phase due to a variation, temperature change, aged deterioration, etc., of their circuits, so in general, they do not operate at an equal amplitude and at an equal phase, thus giving rise to an error.

In this manner, if an error occurs in the amplitude and phase of the amplifiers 7a through 7d, not only the desired frequency component f1 but the unnecessary frequency components f2, f3, f4 will be included in the output signal O1 outputted from the output hybrid 3b.

Similarly, not only the desired frequency component f2 but also the unnecessary frequency components f1, f3, f4 are included in the output signal O2, and not only the desired frequency component f3 but also the unnecessary frequency components f1, f2, f4 are included in the output signal O3, and in addition, not only the desired frequency component f4 but also the unnecessary frequency components f1, f2, f3 are included in the output signal O4.

As a result, if the feedback circuit arrangement of FIG. 4 is not applied, in cases where the amplifiers 7a through 7d do not operate at an equal amplitude and an equal phase, the isolation mutually among the individual output terminals 9a through 9d deteriorates, and hence, the quality of communication also deteriorates.

Accordingly, in order to solve this problem, the feedback circuit arrangement of FIG. 4 is applied.

That is, the output coupling circuits 8a through 8d extract a part of the output signals O1 through O4, respectively, and input them to the down converter 10 as output extraction signals U1 through U4.

The down converter 10 converts the output extraction signals U1 through U4 into IF frequencies, and also the AD converter 11 converts IF frequency signals into the digital signals D1 through D4, respectively.

At this time, amplitude information of not only the desired frequency component f1 of the output signal O1 but also the unnecessary frequency components f2, f3, f4 is included in the digital signal D1.

Similarly, amplitude information of not only the desired frequency component f2 of the output signal O2 but also the unnecessary frequency components f1, f3, f4 is included in the digital signal D2, and amplitude information of not only the desired frequency component f3 of the output signal O3 but also the unnecessary frequency components f1, f2, f4 is included in the digital signal D3, and amplitude information of not only the desired frequency component f4 of the output signal O4 but also the unnecessary frequency components f1, f2, f3 is included in the digital signal D4.

Hereafter, the digital signals D1 through D4 are inputted to the frequency selection circuit 13Da.

The frequency selection circuit 13Da passes, with respect to the digital signal D1, the amplitude information of the frequency components f2 through f4 other than the desired frequency component f1 among the frequency components f1 through f4 to the side of the control signal generation circuit 14D.

Similarly, the frequency selection circuit 13Da passes, with respect to the digital signal D2, the amplitude information of the frequency components f1, f3, f4 other than the desired frequency component f2 to the side of the control signal generation circuit 14D, and passes, with respect to the digital signal D3, the amplitude information of the frequency components f1, f2, f4 other than the desired frequency component f3 to the side of the control signal generation circuit 14D, and passes, with respect to the digital signal D4, the amplitude information of the frequency components f1 through f3 other than the desired frequency component f4 to the side of the control signal generation circuit 14D.

At this time, the passing frequencies in the frequency selection circuit 13Da are decided based on an input signal from the channel assignment part 15.

The control signal generation circuit 14D inputs control signals to the gain and phase control circuits 4Da through 4Dd, so that the amplitudes of the input signals become small.

At this time, the control signals are generated based on the input signals from the frequency selection circuit 13Da and the input signal from the channel assignment part 15.

According to this, in the multiport amplifier shown in FIG. 4, the amplitude difference and the phase difference among the output signals from the amplifiers 7a through 7d are reduced, and the unnecessary frequency components included in each of the output signals O1 through O4 from the output hybrid 3b are removed.

As a result, similar to the above-mentioned second embodiment, the isolation mutually among the individual output terminals 9a through 9d is improved, whereby the quality of communication is improved.

Figure 5:
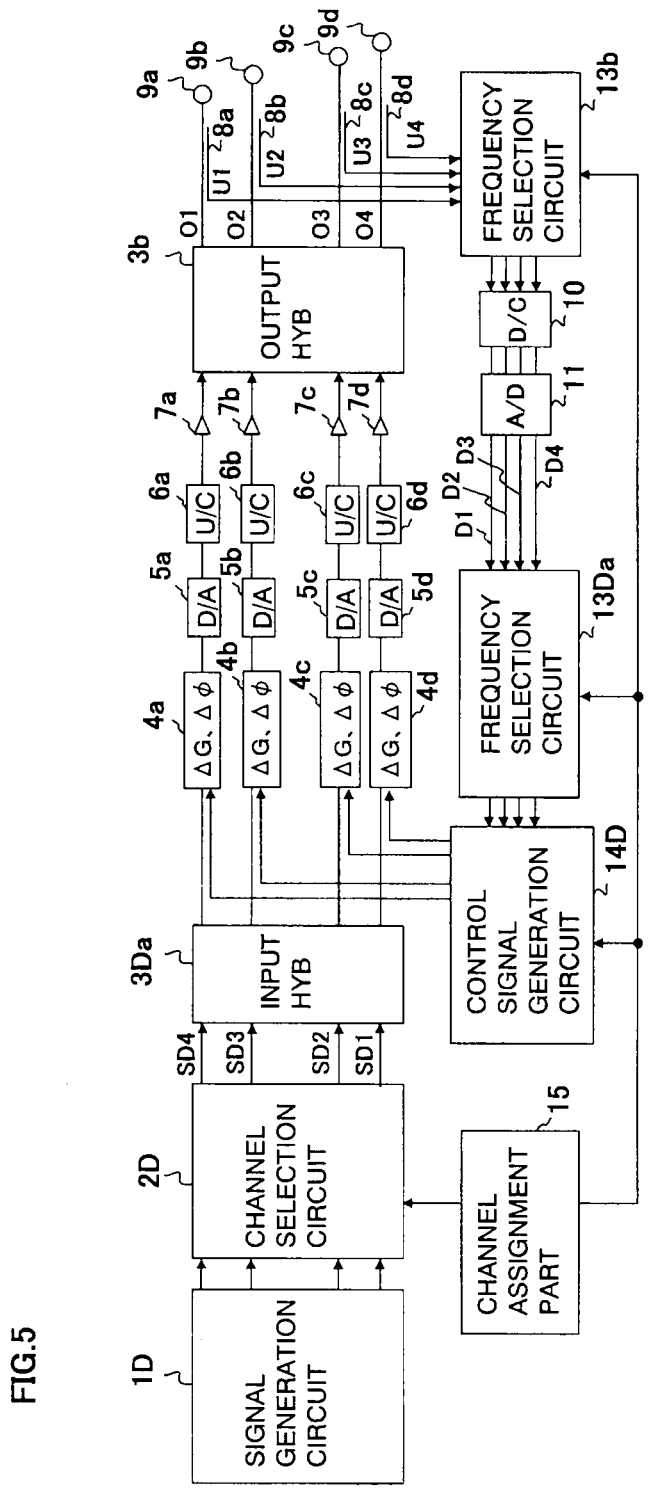
FIG. 5 is a block diagram showing a second arrangement example of the multiport amplifier according to the third embodiment of the present invention. (Third Embodiment)

Here, note that the multiport amplifier according to the third embodiment of the present invention is not limited to the arrangement of FIG. 4, but as shown in FIG. 5, for example, another frequency selection circuit 13b may be additionally inserted between the output coupling circuits 8a through 8d and the down converter 10.

The frequency selection circuit 13b operates at RF frequencies in response to the signal from the channel assignment part 15.

In the arrangement of FIG. 5, too, it is possible to obtain the same operational effects as mentioned above.

In addition, in the case of FIG. 5, the frequency selection circuit 13b is arranged at the preceding stage of the down converter 10, so the desired frequency components with larger amplitudes as compared with those of the unnecessary frequency components can be attenuated to a larger extent than in the case of FIG. 4.

Accordingly, the dynamic range of reception sensitivity required of the down converter 10 can be reduced, so that it becomes possible to obtain the device in an easy manner.

In addition, in place of the frequency selection circuit 13b in FIG. 5, another frequency selection circuit 13c may be inserted between the down converter 10 and the AD converter 11, as shown in Fig.

The frequency selection circuit 13c operates at IF frequencies in response to the signal from the channel assignment part 15.

Figure 6:
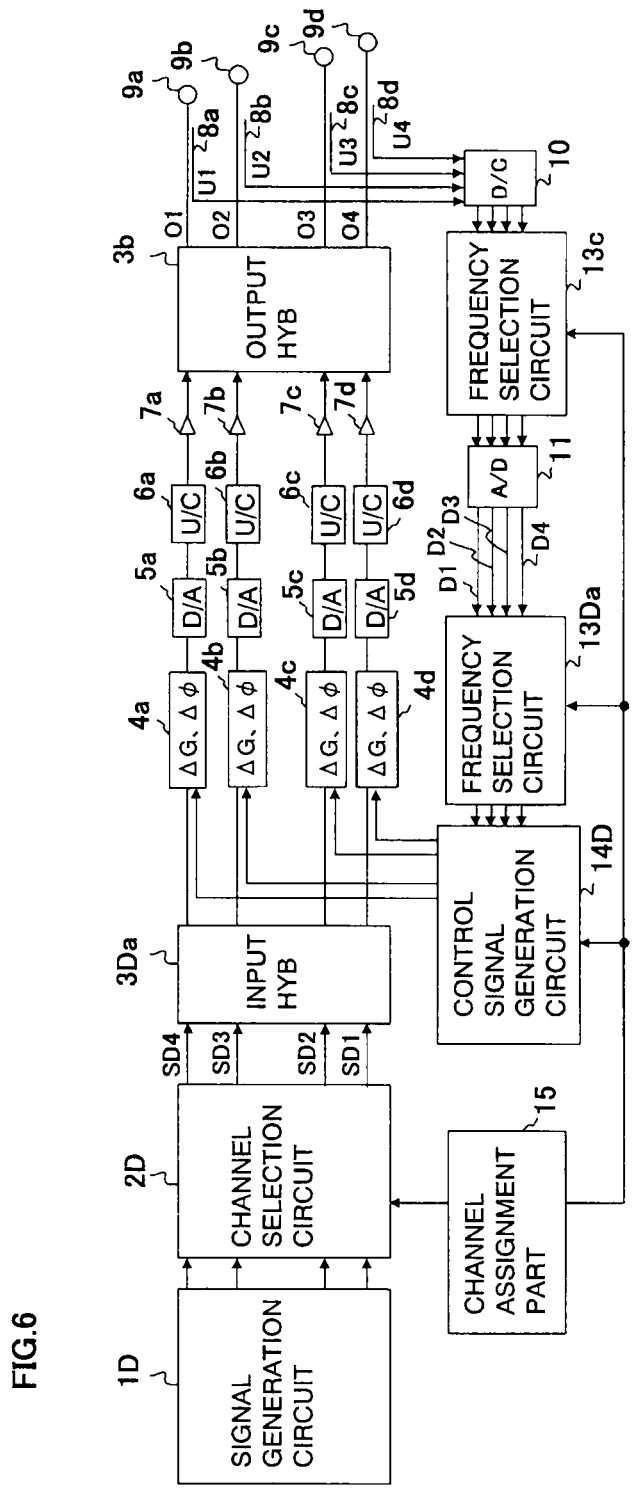
FIG. 6 is a block diagram showing a third arrangement example of the multiport amplifier according to the third embodiment of the present invention. (Third Embodiment)

In the arrangement of FIG. 6, too, it is possible to obtain the same effects as mentioned above.

In addition, in the case of FIG. 6, the frequency selection circuit 13c is arranged at the preceding stage of the AD converter 11, so the desired frequency components with larger amplitudes as compared with those of the unnecessary frequency components can be attenuated to a larger extent than in the case of FIG. 4.

Accordingly, the dynamic range of reception sensitivity required of the AD converter 11 can be reduced, so that it becomes possible to obtain the device in an easy manner.

Figure 7:
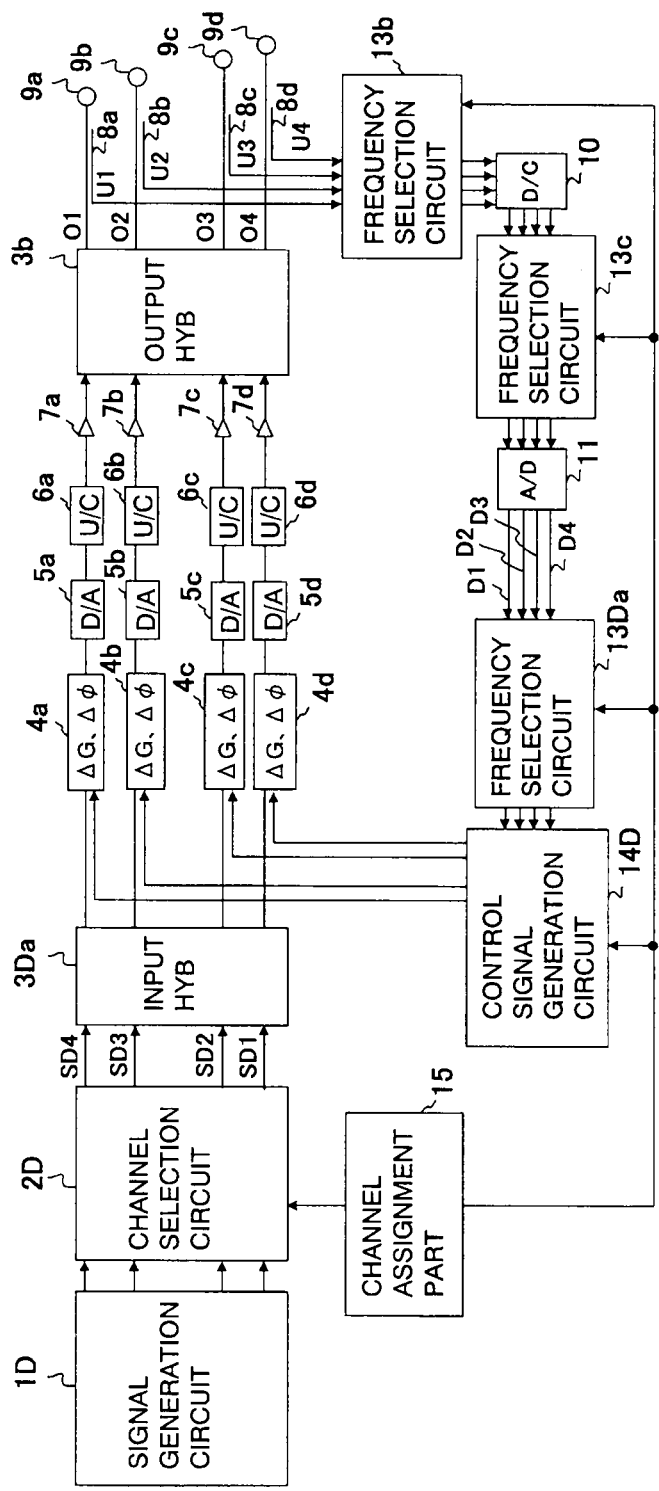
FIG. 7 is a block diagram showing a fourth arrangement example of the multiport amplifier according to the third embodiment of the present invention. (Third Embodiment)

Moreover, by combining the arrangements of FIG. 5 and FIG. 6 with each other, as shown in FIG. 7, the frequency selection circuit 13b, which operates at RF frequencies, may be inserted between the output coupling circuits 8a through 8d and the down converter 10, and the frequency selection circuit 13c, which operates at IF frequencies, may be inserted between the down converter 10 and the AD converter 11.

In the arrangement of FIG. 7, too, it is possible to obtain the same effects as mentioned above.

In addition, in the case of FIG. 7, the frequency selection circuit 13b is arranged at the preceding stage of the down converter 10, so the desired frequency components with larger amplitudes as compared with those of the unnecessary frequency components can be attenuated to a larger extent than in the case of FIG. 4, thus making it possible to reduce the dynamic range of reception sensitivity required of the down converter 10.

Further, because the frequency selection circuit 13c is arranged at the preceding stage of the AD converter 11, the desired frequency components with larger amplitudes as compared with those of the unnecessary frequency components can be attenuated to a larger extent than in the case of FIG. 4, thus making it possible to reduce the dynamic range of reception sensitivity required of the AD converter 11.

Accordingly, it becomes possible to obtain the device in an easy manner.

Furthermore, in the third embodiment (FIG. 4 through FIG. 7) of the present invention, the case where the gain and phase control circuits 4a through 4d and the amplifiers 7a through 7d are four ports, respectively, has been explained by way of example, but the number of ports can be set to an arbitrary plural number (i.e., equal to or greater than two).

Fourth Embodiment

Figure 8:
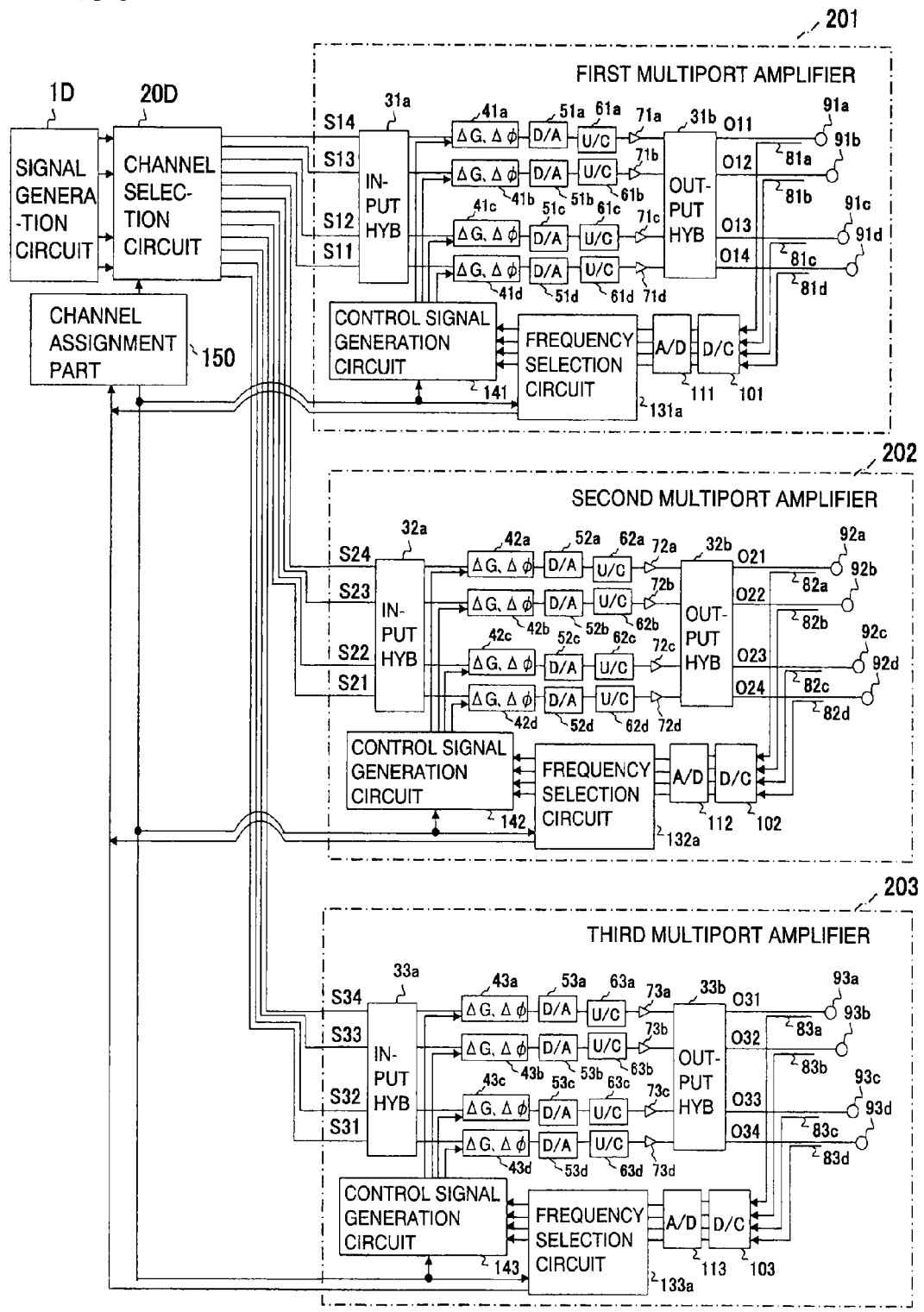
FIG. 8 is a block diagram showing a first arrangement example of a wireless device using multiport amplifiers according to a fourth embodiment of the present invention. (Fourth Embodiment)

Although in the above-mentioned first through third embodiments (FIG. 1 through FIG. 7), attention is focused on a multiport amplifier, a wireless device may be constructed such that two or more (herein, "three") multiport amplifiers are arranged in parallel to each other, as shown in FIG. 8.

FIG. 8 is a block diagram showing a wireless device according to a fourth embodiment of the present invention, wherein the wireless device using first through third multiport amplifiers 201 through 203 each having the arrangement of FIG. 4 is shown.

In FIG. 8, those components which are similar to the above-mentioned ones (see FIG. 4) are denoted by the same reference numerals and characters as those in the above-mentioned embodiments, or with "0", "1", "2", and "3" being attached to reference numerals.

The first multiport amplifier 201 has, as an arrangement from an input hybrid 31a to output terminals 91a through 91d, an output hybrid 31b, gain and phase control circuits 41a through 41d, DA converters 51a through 51d, up converters 61a through 61d, amplifiers 71a through 71d, and output coupling circuits 81a through 81d, and at the same time, has, as a feedback circuit, a down converter 101, an AD converter 111, a frequency selection circuit 131a, and a control signal generation circuit 141.

Similarly, the second multiport amplifier 202 has, as an arrangement from an input hybrid 32a to output terminals 92a through 92d, an output hybrid 32b, gain and phase control circuits 42a through 42d, DA converters 52a through 52d, up converters 62a through 62d, amplifiers 72a through 72d, and output coupling circuits 82a through 82d, and at the same time, has, as a feedback circuit, a down converter 102, an AD converter 112, a frequency selection circuit 132a, and a control signal generation circuit 142.

In addition, the third multiport amplifier 203 has, as an arrangement from an input hybrid 33a to output terminals 93a through 93d, an output hybrid 33b, gain and phase control circuits 43a through 43d, DA converters 53a through 53d, up converters 63a through 63d, amplifiers 73a through 73d, and output coupling circuits 83a through 83d, and at the same time, has, as a feedback circuit, a down converter 103, an AD converter 113, a frequency selection circuit 133a, and a control signal generation circuit 143.

A signal generation circuit 1D, a channel selection circuit 20D and a channel assignment part 150 are connected in common to the first through third multiport amplifiers 201 through 203 of a parallel arrangement.

The channel assignment part 150 is connected to the feedback circuit in each of the multiport amplifiers 201 through 203, and it is constructed such that desired frequency components are inputted from the frequency selection circuits 131a through 133a in the individual feedback circuits.

In addition, the channel selection circuit 20D or the channel assignment part 150 is provided with an input signal gain and phase control circuit (not shown) for controlling the gain and the phase of the input signals, with respect to each of the multiport amplifiers 201 through 203.

The input signal gain and phase control circuit is constructed so as to generate a control signal for amplifying a received signal (desired frequency component).

Next, reference will be made to an operation of the wireless device according to this fourth embodiment of the present invention as shown in FIG. 8.

Here, note that gain and phase control in each of the multiport amplifiers 201 through 203 is as stated above.

First, with respect to the first multiport amplifier 201, the channel assignment part 15 assigns a frequency component f1 to an input signal S11, a frequency component f2 to an input signal S12, a frequency component f3 to an input signal S13, and a frequency component f4 to an input signal S14.

Similarly, with respect to the second multiport amplifier 202, the channel assignment part 15 assigns the frequency component f1 to an input signal S21, the frequency component f2 to an input signal S22, the frequency component f3 to an input signal S23, and the frequency component f4 to an input signal S14.

Also, with respect to the third multiport amplifier 203, the channel assignment part 15 assigns the frequency component f1 to an input signal S31, the frequency component f2 to an input signal S32, the frequency component f3 to an input signal S33, and the frequency component f4 to an input signal S34.

In this manner, in cases where an operation is carried out with the frequency components f1 through f4 being assigned to each of the input signals, in the multiport amplifier 201, ideally, only the frequency component f1 is included in the output signal O11, only the frequency component f2 is included in the output signal O12, only the frequency component f3 is included in the output signal O13, and only the frequency component f4 is included in the output signal O14.

Similarly, in the multiport amplifier 202, only the frequency component f1 is included in the output signal O21, only the frequency component f2 is included in the output signal O22, only the frequency component f3 is included in the output signal O23, and only the frequency component f4 is included in the output signal O24.

Also, in the multiport amplifier 203, only the frequency component f1 is included in the output signal O31, only the frequency component f2 is included in the output signal O32, only the frequency component f3 is included in the output signal O33, and only the frequency component f4 is included in the output signal O34.

Here, consideration is given to a wireless device which operates, by combining, in each of the multiport amplifiers 201 through 203, the output signals of the output terminals 91a, 92a, 93a including only the frequency component f1 with one another, combining or coupling the output signals of the output terminals 91b, 92b, 93b including only the frequency component f2 with one another, and combining the output signals of the output terminals 91c, 92c, 93c including only the frequency component f3 with one another.

At this time, in cases where the output signals from the output terminals 91a, 92a, 93a including only the frequency component f1 are at an equal amplitude and an equal phase, no combining or coupling loss occurs, but as mentioned above, the individual output signals are not at an equal amplitude and an equal phase, so combining loss occurs, and the quality of communication deteriorates. This is the same with respect to the frequencies f2, f3.

In order to reduce this influence, in the case of focusing attention on the first multiport amplifier 201, for example, the output coupling circuits 81a through 81d input to the down converter 101 output extraction signals U1 through U4 which are obtained by extracting a part of the output signals O11 through O14, respectively.

The down converter 101 converts the output extraction signals U11 through U14 into IF frequencies, and also the AD converter 111 converts signals of the IF frequencies into digital signals, respectively.

At this time, assuming that the digital signals of the individual channels are D11 through D14, respectively, amplitude information of not only the desired frequency component f1 of the output signal O11 but also the unnecessary frequency components f2, f3, f4 is included in the digital signal D11.

Similarly, amplitude information of not only the desired frequency component f2 of the output signal O12 but also the unnecessary frequency components f1, f3, f4 is included in the digital signal D12, and amplitude information of not only the desired frequency component f3 of the output signal O13 but also the unnecessary frequency components f1, f2, f4 is included in the digital signal D13, and amplitude information of not only the desired frequency component f4 of the output signal O14 but also the unnecessary frequency components f1, f2, f3 is included in the digital signal D14.

Accordingly, the frequency selection circuit 131a inputs the desired frequency component f1 included in the digital signal D11 to the channel assignment part 150, and at the same time, inputs the unnecessary frequency components f2, f3, f4 included in the digital signal D11 to the control signal generation circuit 141.

Similarly, the frequency selection circuit 131a inputs the desired frequency component f2 included in the digital signal D12 to the channel assignment part 150, and at the same time, inputs the unnecessary frequency components f1, f3, f4 included in the digital signal D12 to the control signal generation circuit 141.

Also, the frequency selection circuit 131a inputs the desired frequency component f3 included in the digital signal D13 to the channel assignment part 150, and at the same time, inputs the unnecessary frequency components f1, f2, f4 included in the digital signal D13 to the control signal generation circuit 141.

Further, the frequency selection circuit 131a inputs the desired frequency component f4 included in the digital signal D14 to the channel assignment part 150, and at the same time, inputs the unnecessary frequency components f1 through f3 included in the digital signal D14 to the control signal generation circuit 141.

The operation of the control signal generation circuit 141 is as described in the above-mentioned third embodiment.

The above-mentioned operations are the same for the second and the third multiport amplifiers 202, 203. As a result, the signals having only the desired frequency components of the individual multiport amplifiers 201 through 203 are inputted to the channel assignment part 150.

Hereafter, the channel selection circuit 20D receives the signals having only the desired frequency components of the individual multiport amplifiers 201 through 203 from the channel assignment part 150, and controls the signals inputted from the signal generation circuit 1D by the use of the input signal gain and phase control circuit in the channel selection circuit 20D in such a manner that the amplitude levels of the signals of the desired frequencies become large.

In this manner, by controlling the levels of the signals inputted to the individual multiport amplifiers 201 through 203, the amplitude difference and the phase difference mutually among the individual signals can be decreased, and the amplitude difference and the phase difference in the output signals from the individual multiport amplifiers 201 through 203 can be decreased, so that the combining loss of the output signals can be thereby reduced. As a result, the quality of communication becomes good.

Figure 9:
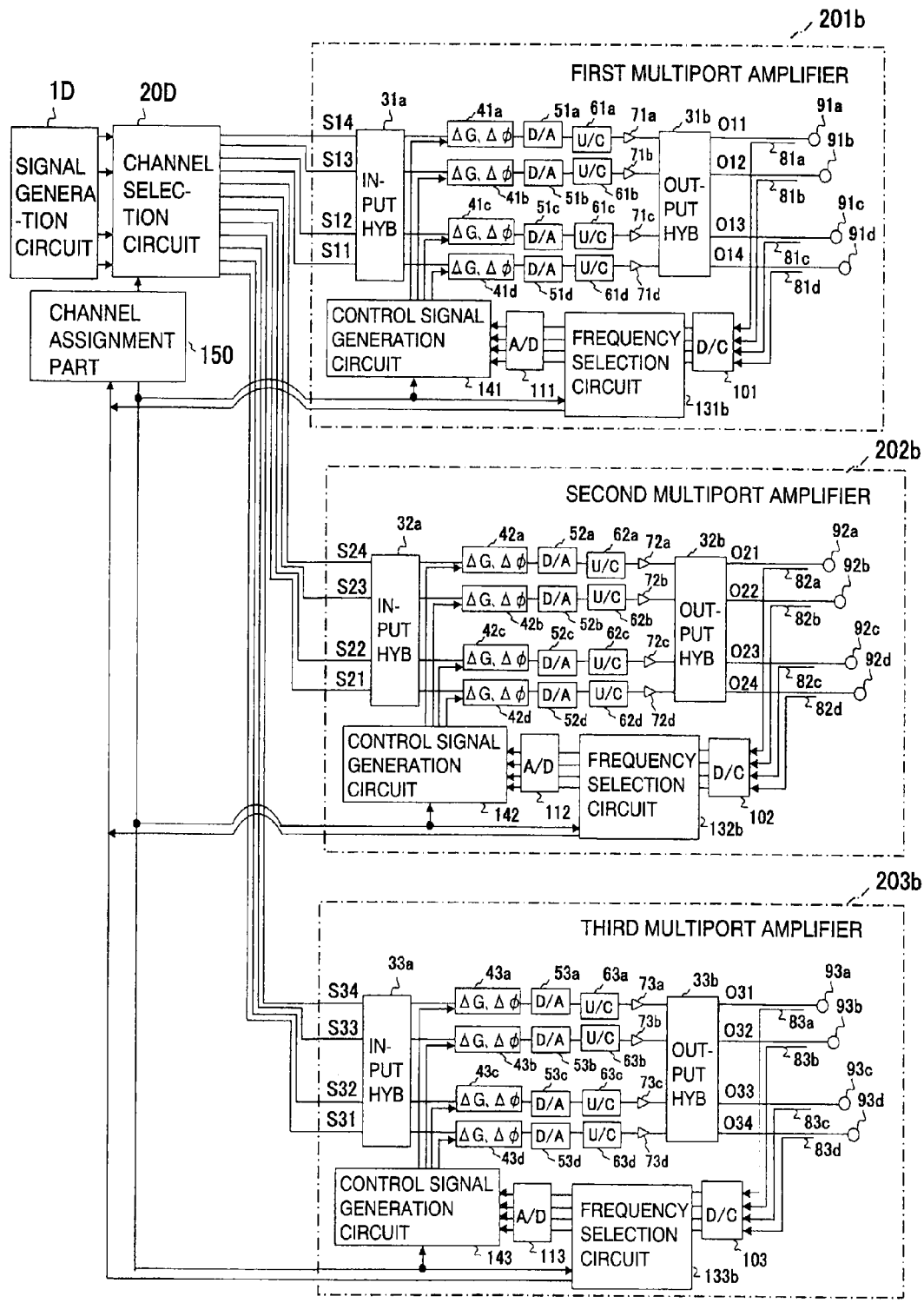
FIG. 9 is a block diagram showing a second arrangement example of the wireless device using multiport amplifiers according to the fourth embodiment of the present invention. (Fourth Embodiment)

Here, note that in FIG. 8, in each of the multiport amplifiers 201 through 203, the frequency selection circuits 131a through 133a are inserted between the AD converters 111 through 113 and the control signal generation circuits 141 through 143, respectively, but for example, as shown in FIG. 9, in each of multiport amplifiers 201b through 203b, frequency selection circuits 131b through 133b may be inserted between the down converters 101 through 103 and the AD converters 111 through 113, respectively, and in this case, effects equivalent to those as stated above can be obtained.

In addition, although in FIG. 8, the arrangement (FIG. 4) of the above-mentioned third embodiment is applied as each of the multiport amplifiers 201 through 203, equivalent effects will be obtained even if any of the arrangements (FIG. 1 through FIG. 7) of the above-mentioned first through third embodiments is applied.

Moreover, in each of the multiport amplifiers 201 through 203, the case where the gain and phase control circuits and the amplifiers are four ports, respectively, has been shown, but the number of ports can be set to an arbitrary plural number (i.e., equal to or greater than two).

Further, although the case where the three multiport amplifiers are arranged in parallel with one another has been shown, it goes without saying that it is possible to arrange an arbitrary plurality of (equal to or greater than two) multiport amplifiers in parallel with one another.

As stated above, the wireless device (FIG. 8 and FIG. 9) according to the fourth embodiment of the present invention is provided with the first through third multiport amplifiers 201 through 203 (201b through 203b) which are arranged in parallel with one another.

In addition, in the inside of the channel selection circuit 20D or the channel assignment part 150, there is provided the input signal gain and phase control circuit which is connected to the feedback circuits (frequency selection circuits) in the individual multiport amplifiers.

In each of the multiport amplifiers, the output extraction signals received from the plurality of output coupling circuits are separated into two signals by means of the frequency selection circuit in the feedback circuit, and one of the two signals thus separated is inputted to the control signal generation circuit 141, 142 or 143 in the feedback circuit, and the other of the two signals is inputted to the input signal gain and phase control circuit.

The control signal generation circuits 141 through 143 generate control signals for attenuating the received signals, and the input signal gain and phase control circuit generates control signals for amplifying the received signals. As a result of this, it is effective to obtain a wireless device with good quality of communication.

Fifth Embodiment

Figure 10:
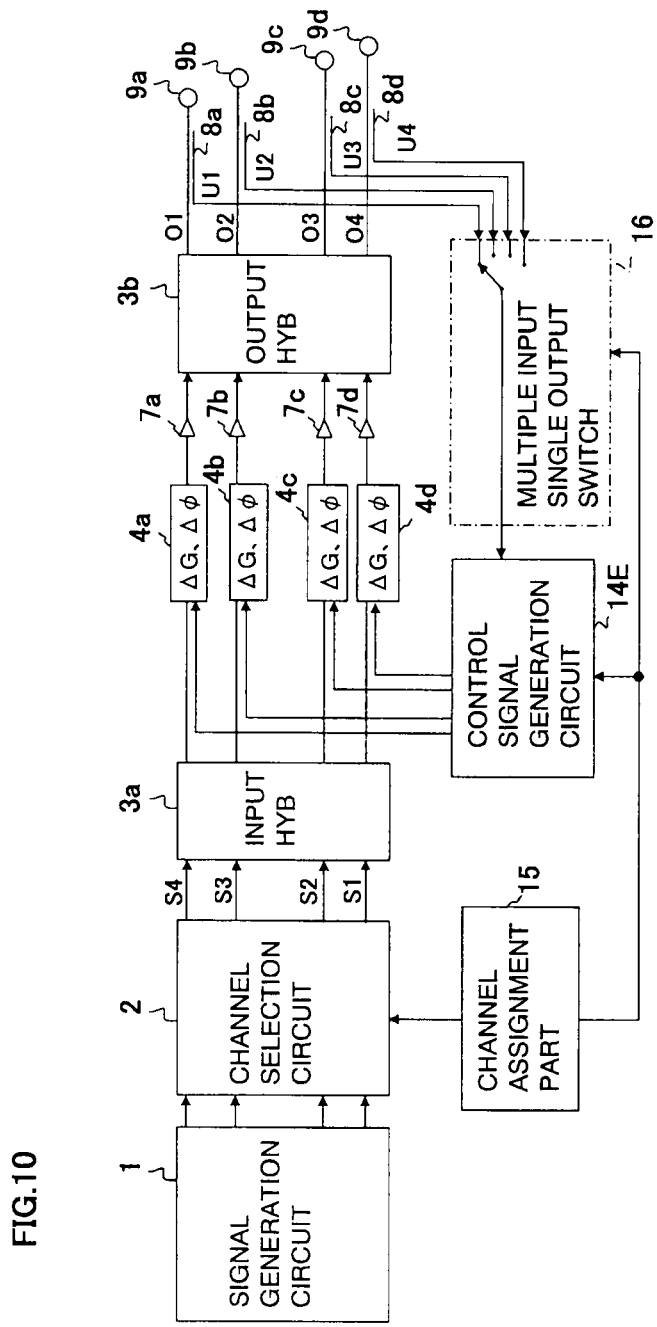
FIG. 10 is a block diagram showing the arrangement of a multiport amplifier according to a fifth embodiment of the present invention. (Fifth Embodiment)

Although in the above-mentioned first embodiment (FIG. 1), the frequency selection circuit 13a is arranged at the input side of the control signal generation circuit 14, a first multiple input single output switch 16 (hereinafter referred to simply as a "multiple input single output switch 16") may instead be arranged, as shown in FIG. 10.

FIG. 10 is a block diagram showing the arrangement of a multiport amplifier according to a fifth embodiment of the present invention, wherein similar to the above (FIG. 1), an arrangement thereof having an error compensation circuit with the number of ports being four is shown.

In FIG. 10, those components which are similar to the above-mentioned ones (see FIG. 1) are denoted by the same reference numerals and characters as those in the above-mentioned embodiment, or with "E" being attached to reference numerals, and a detailed description thereof is omitted.

In this case, at the input side of a control signal generation circuit 14E, there is arranged the multiple input single output switch 16 in place of the above-mentioned frequency selection circuit 13a (FIG. 1).

Next, reference will be made to an operation according to this fifth embodiment of the present invention as shown in FIG. 10.

Similarly as stated above, based on a signal outputted from the channel assignment part 15, the input signals from the signal generation circuit 1 are assigned with frequency components f1 through f4 for individual channels, respectively, by means of the channel selection circuit 2.

The individual input signals S1 through S4 by way of the channel selection circuit 2 correspond to the individual frequency components f1 through f4, respectively, wherein the input signal S1 has only the frequency component f1, the input signal S2 has only the frequency component f2, the input signal S3 has only the frequency component f3, and the input signal S4 has only the frequency component f4.

The input signals S1 through S4 are inputted to mutually different input terminals of the input hybrid 3a, respectively, so as to be distributed and combined therein, are further amplified in the amplifiers 7a through 7d, and are then outputted from the output hybrid 3b as the output signals O1 through O4 after being distributed and combined again by the output hybrid 3b.

Here, if the amplifiers 7a through 7d are in ideal conditions, the frequencies of the output signals O1 through O4 will have only the frequency components f1 through f4, respectively, similar to the input signals S1 through S4. As a result, only the frequency components f1 through f4 are outputted from the output terminals 9a through 9d, respectively, and the output signals O1 through O4 do not mutually interfere with one another.

However, in general, the amplifiers 7a through 7d change in gain and phase in accordance with a variation, temperature change, aged deterioration, etc., of their circuits, so they do not operate at an equal amplitude and at an equal phase, thus giving rise to an error.

At this time, if the feedback circuit arrangement of FIG. 10 is not applied, not only the desired frequency component f1 but also the unnecessary frequency components f2, f3, f4 (unnecessary or undesired signals) are included in the output signal O1 from the output hybrid 3b, for example, and similarly, not only a desired frequency component but also unnecessary frequency components are included in the other output signals O2 through O4.

In this manner, in cases where the amplifiers 7a through 7d do not operate at an equal amplitude and an equal phase, the isolation among the output terminals 9a through 9d deteriorates, and hence, the quality of communication also deteriorates. Accordingly, in order to solve this problem, the feedback circuit arrangement of FIG. 10 is applied.

In FIG. 10, the output coupling circuits 8a through 8d extract a part of the output signals O1 through O4, respectively, and input them to the multiple input single output switch 16 as the output extraction signals U1 through U4.

A signal to be inputted to the control signal generation circuit 14E among the output extraction signals U1 through U4 inputted to the multiple input single output switch 16 can be controlled by means of the multiple input single output switch 16.

In addition, whether which signal of the output extraction signals U1 through U4 is to be passed is decided based on a signal inputted to the multiple input single output switch 16 from the channel assignment part 15.

The control signal generation circuit 14E detects the input signal from the multiple input single output switch 16, and inputs control signals to the gain and phase control circuits 4a through 4d, respectively, so that the amplitude level of the input signal thus detected becomes small.

The control signals from the control signal generation circuit 14E are generated based on the individual input signals from the multiple input single output switch 16 and from the channel assignment part 15.

As described above, according to the fifth embodiment (FIG. 10) of the present invention, in the multiport amplifier which is composed of the input hybrid 3a to which the plurality of input signals S1 through S4 corresponding to the plurality of channels are inputted, the output hybrid 3b which outputs the plurality of output signals O1 through O4 corresponding to the plurality of input signals S1 through S4 from the plurality of output terminals 9a through 9d, and the plurality of amplifiers 7a through 7d and the plurality of gain and phase control circuits 4a through 4d which are inserted between the input hybrid 3a and the output hybrid 3b, wherein the plurality of amplifiers 7a through 7d are combined in parallel with one another, provision is made for the plurality of output coupling circuits 8a through 8d that are inserted between the output hybrid 3b and the plurality of output terminals 9a through 9d so that they receive the output extraction signals U1 through U4 corresponding to the plurality of output signals O1 through O4, and the feedback circuit that is inserted between the plurality of output coupling circuits 8a through 8d and the plurality of gain and phase control circuits 4a through 4d, wherein the feedback circuit has the multiple input single output switch 16.

Due to this, the amplitude difference and the phase difference among the signals outputted from the amplifiers 7a through 7d can be reduced, and the unnecessary frequency components (unnecessary or undesired signals) included in each of the output signals O1 through O4 can be removed, as a result of which the isolation mutually among the output terminals 9a through 9d can be improved, thus making it possible to improve the quality of communication.

In addition, the control signals are generated after attenuating desired frequency components, which are larger in amplitude as compared with unnecessary frequency components, by means of the multiple input single output switch 16, and inputting them to the control signal generation circuit 14E, so that a large dynamic range is not required for the reception sensitivity of the control signal generation circuit 14E, thus making it possible to achieve the multiport amplifier in an easy and inexpensive manner.

Here, note that in FIG. 10, the four-port multiport amplifier provided with the four gain and phase control circuits 4a through 4d and the four amplifiers 7a through 7d has been shown, but the number of ports can be set to an arbitrary plural number (i.e., equal to or greater than two).

In addition, here, the case where the frequency selection circuit 13a in FIG. 1 is replaced by the multiple input single output switch 16 has been shown, but in cases where the band stop filter 21 in FIG. 2 is replaced by the multiple input single output switch 16, equivalent effects can be obtained.

In the following, further specific reference will be made to the operational effects according to the above-mentioned first through fifth embodiments, while referring to FIG. 11 through FIG. 13.

Figure 11:
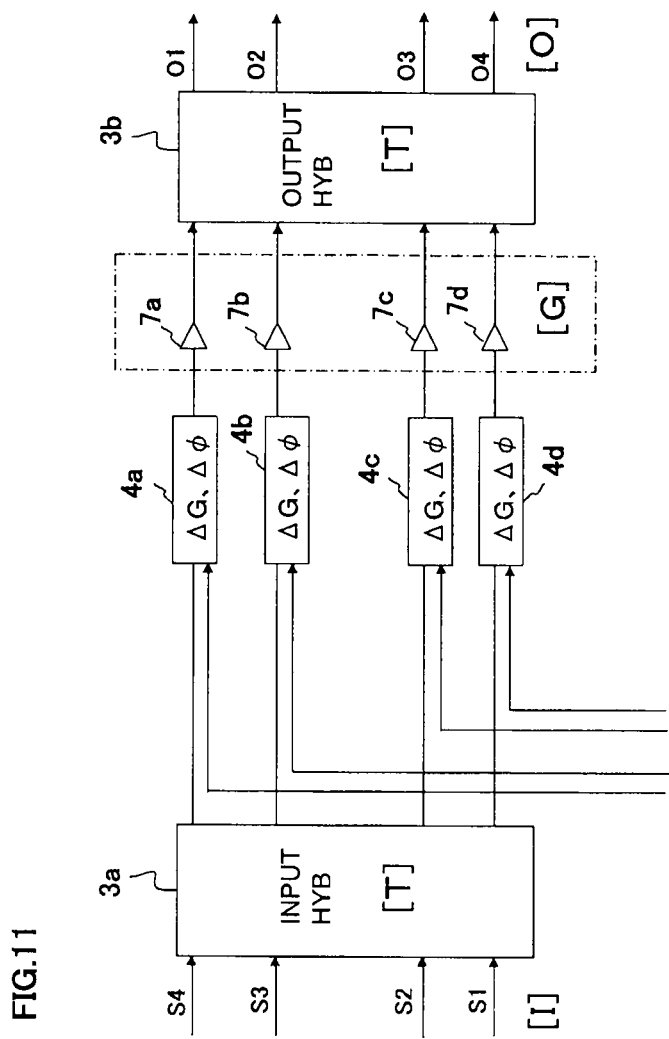
FIG. 11 is a block diagram generically showing the essential parts of a multiport amplifier in a matrix representation according to the first through fifth embodiments of the present invention. (First through Fifth Embodiments)

FIG. 11 is a block diagram generically showing the essential parts of a multiport amplifier in a matrix representation ([I], [T], [G], [O]) according to the first through fifth embodiments of the present invention, wherein a four-port input hybrid 3a, gain and phase control circuits 4a through 4d, amplifiers 7a through 7d, and an output hybrid 3b are shown.

In FIG. 11, when output signals O1 through O4 appearing at output terminals are shown in a matrix representation, the following equation (1) results.

[EQUATION 1]

$$[O] = [T][G][T][I] \qquad (1)$$

In the equation (1), individual matrices [O], [G], [T], and [I] represent the output signals O1 through O4, the amplifiers 7a through 7d, the individual hybrids 3a, 3b, and the input signals S1 through S4, respectively.

In addition, the dimensions of the individual matrices are 4×1, 4×4 (diagonal matrix), 4×4, and 4×1, respectively.

Here, note that the individual characteristics of the input and output hybrids 3a, 3b are assumed to be the same. Also, it is assumed that the passing amplitudes and the passing phases of the gain and phase control circuits 4a through 4d are ΔGi=0 and Δφ=0 (i=1 through 4), respectively.

The input signal matrix [I] is represented as shown in the following equation (2).

[EQUATION 2]

$$[I] = [S_4, S_3, S_2, S_1]^t \qquad (2)$$

In the equation (2), "t" means a transposed matrix. Also, Si (i=1 through 4) are complex numbers indicating the individual input signals S1 through S4, respectively.

On the other hand, the output signal matrix [O] is represented as shown in the following equation (3).

[EQUATION 3]

$$[O] = [O_1, O_2, O_3, O_4]^t \qquad (3)$$

In addition, the matrix [G] indicating the characteristics of the amplifiers 7a through 7d becomes a diagonal matrix as shown in the following equation (4).

[EQUATION 4]

$$[G] = \begin{bmatrix} g_1 & 0 & 0 & 0 \\ 0 & g_2 & 0 & 0 \\ 0 & 0 & g_3 & 0 \\ 0 & 0 & 0 & g_4 \end{bmatrix} \qquad (4)$$

In the equation (4), gi (i=1 through 4) are complex numbers indicating the individual passing amounts of the amplifiers 7a through 7d, respectively.

On the other hand, the matrix [T] indicating the individual hybrids 3a, 3b is represented as shown in the following equation (5).

[EQUATION 5]

$$[T] = \frac{1}{2} \begin{bmatrix} 1 & j & j & -1 \\ j & -1 & 1 & j \\ j & 1 & -1 & j \\ -1 & j & j & 1 \end{bmatrix} \qquad (5)$$

Here, note that in the equation (4), the individual passing amounts of the amplifiers 7a through 7d are represented as shown in the following equation (6).

[EQUATION 6]

$$g_i = (G + G_i) e^{j(\Phi + \Phi_i)} \approx (G + G_i)(1 + (\Phi + \Phi_i)) \qquad (6)$$

In the equation (6), Gi and φi (i=1 through 4) are the differences with respect to the gains G and the passing phases φ of the amplifiers 7a through 7d, respectively.

From the equation (5) and the equation (6), the individual matrices [T] [G] [T] are represented as shown in the following equation (7).

[EQUATION 7]

$$[T][G][T] = \frac{1}{4} \begin{bmatrix} a & jc & jb & -d \\ jc & -a & -d & -jb \\ jb & -d & -a & -jc \\ -d & -jb & -jc & a \end{bmatrix} \qquad (7)$$

$a \approx G_1 - G_2 - G_3 + G_4 +$
$\qquad j\{G(\Phi_1 - \Phi_2 - \Phi_3 + \Phi_4) + \Phi(G_1 - G_2 - G_3 + G_4)\}$
$b \approx G_1 + G_2 - G_3 - G_4 +$
$\qquad j\{G(\Phi_1 + \Phi_2 - \Phi_3 - \Phi_4) + \Phi(G_1 + G_2 - G_3 - G_4)\}$
$c \approx G_1 - G_2 + G_3 - G_4 +$
$\qquad j\{G(\Phi_1 - \Phi_2 + \Phi_3 - \Phi_4) + \Phi(G_1 - G_2 + G_3 - G_4)\}$
$d \approx G_1 + G_2 + G_3 + G_4 +$
$\qquad j\{G(\Phi_1 + \Phi_2 + \Phi_3 + \Phi_4) + \Phi(G_1 + G_2 + G_3 + G_4)\}$ In addition, from the equation (2), the equation (3) and the equation (7), the output signal matrix [O] is represented as shown in the following equation (8).

[EQUATION 8]

$$[O] = \begin{bmatrix} O_1 \\ O_2 \\ O_3 \\ O_4 \end{bmatrix} = \frac{1}{4} \begin{bmatrix} a & jc & jb & -d \\ jc & -a & -d & -jb \\ jb & -d & -a & -jc \\ -d & -jb & -jc & a \end{bmatrix} \begin{bmatrix} S_4 \\ S_3 \\ S_2 \\ S_1 \end{bmatrix} \qquad (8)$$

$$= \frac{1}{4} \begin{bmatrix} aS_4 + jcS_3 + jbS_2 - dS_1 \\ jcS_4 - aS_3 - dS_2 - jbS_1 \\ jbS_4 - dS_3 - aS_2 - jcS_1 \\ -dS_4 - jbS_3 - jcS_2 + aS_1 \end{bmatrix}$$

Here, in cases where there are no errors in amplitude and phase of the amplifiers 7a through 7d, the following equations (9) hold good.

[EQUATION 9]

$$G_1=G_2=G_3=G_4$$

$$\Phi_1=\Phi_2=\Phi_3=\Phi_4 \quad (9)$$

Accordingly, as will be clear from the equations (7) and (8), in cases where there are no errors in amplitude and phase of the amplifiers 7a through 7d, the following equation (10) holds good, and hence only desired signals are outputted.

[EQUATION 10]

$$a=b=c=0 \quad (10)$$

That is, the input signal S1 to an individual input terminal of the input hybrid 3a is outputted only as the output signal O1 from an individual output terminal of the output hybrid 3b, and similarly, the input signals S2 through S4 are outputted only as the output signals O2 through O4 from individual output terminals of the output hybrid 3b, respectively.

Here, the conditions of the individual frequency components f1 through f3 are represented by the following equations (11).

[EQUATION 11]

$$f_1: G_1-G_2-G_3+G_4=0, \Phi_1-\Phi_2-\Phi_3+\Phi_4=0$$

$$f_2: G_1-G_2+G_3-G_4=0, \Phi_1-\Phi_2+\Phi_3-\Phi_4=0$$

$$f_3: G_1+G_2-G_3-G_4=0, \Phi_1+\Phi_2-\Phi_3-\Phi_4=0 \quad (11)$$

At this time, in cases where the condition of the frequency component f1 in the equations (11) is satisfied, "a" becomes equal to 0 (a=0), and in cases where the condition of the frequency component f2 is satisfied, "b" becomes equal to 0 (b=0), and in cases where the condition of the frequency component f3 is satisfied, "c" becomes equal to 0 (c=0).

That is, as will be clear from the equation (8), in cases where the condition of the frequency component f1 in the equations (11) is satisfied, an undesired signal (input signal S4) with respect to the output signal O1, an undesired signal (input signal S3) with respect to the output signal O2, an undesired signal (input signal S2) with respect to the output signal O3, and an undesired signal (input signal S1) with respect to the output signal O4 are not outputted.

Similarly, in cases where the condition of the frequency component f2 is satisfied, an undesired signal (input signal S3) with respect to the output signal O1, an undesired signal (input signal S4) with respect to the output signal O2, an undesired signal (input signal S1) with respect to the output signal O3, and an undesired signal (input signal S2) with respect to the output signal O4 are not outputted.

Further, in cases where the condition of the frequency component f3 is satisfied, an undesired signal (input signal S2) with respect to the output signal O1, an undesired signal (input signal S1) with respect to the output signal O2, an undesired signal (input signal S4) with respect to the output signal O3, and an undesired signal (input signal S3) with respect to the output signal O4 are not outputted.

Showing this schematically, the output signals O1 through O4 become as shown in the following equation (12).

[EQUATION 12]

$$\begin{array}{cccc} S_4 & S_3 & S_2 & S_1 \\ \downarrow & \downarrow & \downarrow & \downarrow \end{array} \quad (12)$$

$$\begin{array}{c} O_1 \rightarrow \\ O_2 \rightarrow \\ O_3 \rightarrow \\ O_4 \rightarrow \end{array} \begin{bmatrix} f_1 & f_2 & f_3 & - \\ f_2 & f_1 & - & f_3 \\ f_3 & - & f_1 & f_2 \\ - & f_3 & f_2 & f_1 \end{bmatrix}$$

In the following, the equations (11) (the conditions of the individual frequency components f1 through f3) are called a conditional expression for maximum isolation, and a method for calculating the relation between the amplitude difference Gi and the phase difference ϕi of the amplifiers 7a through 7d by the use of this conditional expression will be described.

Note that the conditional expression for maximum isolation is calculated here for the case where the number of the amplifiers 7a through 7d is four, but it is possible to calculate the conditional expression for maximum isolation for other arbitrary numbers (equal to or greater than two) in a similar manner.

The relation between the amplitude difference Gi and the phase difference ϕi of the amplifiers 7a through 7d is calculated by observing the amplitudes of undesired signals at the time when the passing amplitudes and the passing phases of the gain and phase control circuits 4a through 4d are made to change.

For example, in the case of only the input signal S1, the following equation (13) holds good.

[EQUATION 13]

$$[I]=[0,0,0,S_1]^t \quad (13)$$

At this time, when the passing amplitude ΔG2 of the gain and phase control circuit 4b, for example, among the plurality of gain and phase control circuits 4a through 4d is made to change, there exists a certain value of the passing amplitude ΔG2 at the time when the passing amount of an undesired signal at an output terminal of the output signal O1 becomes a minimum (i.e., isolation being at a maximum).

Here, assuming that the value of the passing amplitude ΔG2 at the time when the isolation becomes the maximum is A2opt1, the following equation (14) holds good.

[EQUATION 14]

$$G_1-G_2-A_{2opt1}-G_3+G_4=0 \quad (14)$$

Figure 12:
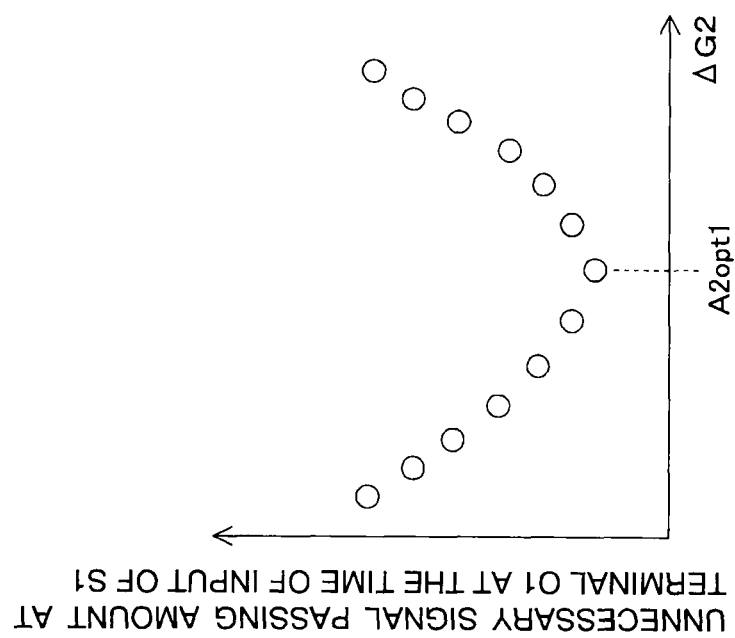
FIG. 12 is an explanation view showing an operation example at the time of the passing amplitude change of the multiport amplifier according to the first through fifth embodiments of the present invention. (First through Fifth Embodiments)

FIG. 12 is an explanatory view showing an example of operation when the passing amplitude changes, wherein the axis of abscissa represents the passing amplitude ΔG2, and the axis of ordinate represents the passing amount of an undesired signal at an output terminal corresponding to the output signal O1 when only the input signal S1 is inputted.

As is clear from FIG. 12, it can be seen that the passing amount of the undesired signal at the output terminal of the output signal O1 becomes a minimum in the case of the passing amplitude ΔG2=A2opt1.

Similarly, in cases where the passing phase Δϕ2 of the gain and phase control circuit 4b is made to change, there exists a certain value of the passing phase Δϕ2 at the time when the isolation of the output signal O1 becomes a maximum.

Here, assuming that the value of the passing phase $\Delta\phi 2$ at the time when the isolation becomes the maximum is P2opt1, the following equation (15) holds good.

[EQUATION 15]

$$\Phi_1 - \Phi_2 - P_{2opt1}\Phi_3 + \Phi_4 = 0 \qquad (15)$$

Figure 13:
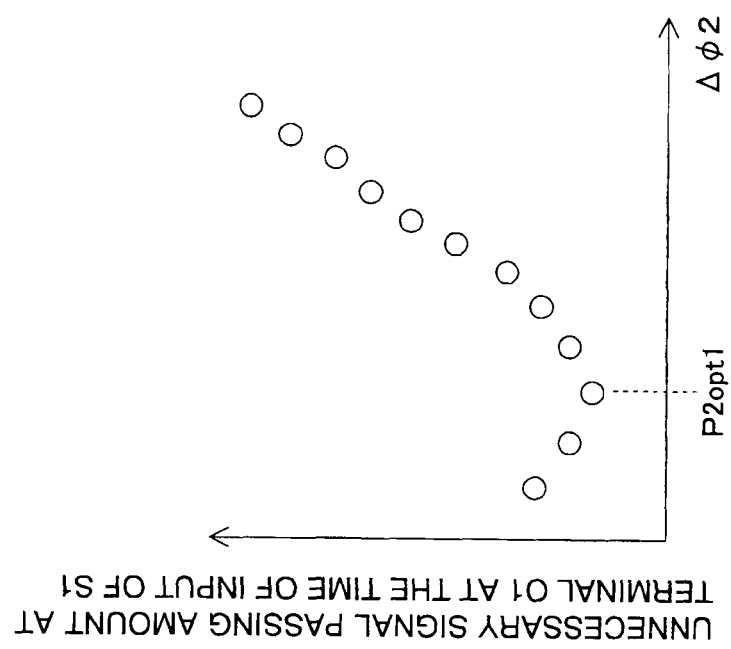
FIG. 13 is an explanation view showing an operation example at the time of the passing phase change of the multiport amplifier according to the first through fifth embodiments of the present invention. (First through Fifth Embodiments)

FIG. 13 is an explanatory view showing an example of operation when the passing phase changes, wherein the axis of abscissa represents the passing phase $\Delta\phi 2$, and the axis of ordinate represents the passing amount of an undesired signal at an output terminal corresponding to the output signal O1 when only the input signal S1 is inputted.

As is clear from FIG. 13, it can be seen that the passing amount of the undesired signal at the output terminal of the output signal O1 becomes a minimum in the case of the passing phase $\Delta\phi 2 = $P2opt1.

Hereafter, similarly, if the passing amplitude $\Delta G2$ (=A2opt2) and the passing phase $\Delta\phi 2$ (=P2opt2) at the time when the passing amount of an undesired signal at an output terminal of the output signal O2 becomes a minimum are taken into consideration, the following equations (16) and (17) will hold good, respectively.

[EQUATION 16]

$$G_1 + G_2 + A_{2opt2} - G_3 - G_4 = 0 \qquad (16)$$

$$\Phi_1 + \Phi_2 + P_{2opt2} - \Phi_3 - \Phi_4 = 0 \qquad (17)$$

Also, if the passing amplitude $\Delta G2$ (=A2opt3) and the passing phase $\Delta\phi 2$ (=P2opt3) at the time when the passing amount of an undesired signal at an output terminal of the output signal O3 becomes a minimum are taken into consideration, the following equations (18) and (19) will hold good.

[EQUATION 17]

$$G_1 - G_2 - A_{2opt3} + G_3 - G_4 = 0 \qquad (18)$$

$$\Phi_1 - \Phi_2 - P_{2opt3} + \Phi_3 - \Phi_4 = 0 \qquad (19)$$

When the equations (14) through (19) are made into simultaneous equations and solutions are calculated for the amplitude differences G2 through G4 and the phase differences $\phi 2$ through $\phi 4$, the following equations (20) through (22) will be obtained.

[EQUATION 18]

$$G_2 = G_1 + \frac{-A_{2opt1} - A_{2opt3}}{2}, \Phi_2 = \Phi_1 + \frac{-P_{2opt1} - P_{2opt3}}{2} \qquad (20)$$

$$G_3 = G_1 + \frac{-A_{2opt1} + A_{2opt2}}{2}, \Phi_3 = \Phi_1 + \frac{-P_{2opt1} + P_{2opt2}}{2} \qquad (21)$$

$$G_4 = G_1 + \frac{A_{2opt2} - A_{2opt3}}{2}, \Phi_4 = \Phi_1 + \frac{P_{2opt2} - P_{2opt3}}{2} \qquad (22)$$

Because the gain differences and phase differences of the amplifiers 7b through 7d with respect to the amplifier 7a are calculated from the equations (20) through (22), it is possible to obtain control signals to be inputted to the gain and phase control circuits 4a through 4d from the control signal generation circuit 14 (14D, 14E) by the use of the equations (20) through (22).

As described above, according to the multiport amplifier related to the first through fifth embodiments of the present invention, the amplitude differences and the phase differences among the individual amplifiers 7a through 7d can be compensated for, and hence the quality of communication is improved.

In addition, by calculating the control signals for the plurality of gain and phase control circuits 4a through 4d based only on the amplitude information of the plurality of output signals O1 through O4 to which undesired signals are outputted, it is possible to achieve the multiport amplifier with a simple structure or arrangement.

Note that the case where the port number of the amplifiers 7a through 7d is four has been shown herein, but in the case of any number (equal to or greater than two) thereof, too, it is possible to compensate for the amplitude difference and the phase difference of each amplifier in a similar manner.

Also, the description of operation has been given in the case of only the input signal S1, but the amplitude differences and the phase differences among the amplifiers 7a through 7d can be similarly compensated for in the case of other arbitrary input signals (input terminals) S2 through S4.

Moreover, an explanation has been given to the case where the amplitude and the phase of the gain and phase control circuit 4b among the plurality of gain and phase control circuits 4a through 4d are made to change, but in cases where the amplitude and phase of arbitrary one(s) of the other gain and phase control circuits 4a, 4c, 4d are made to change, too, it is possible to compensate for the amplitude differences and the phase differences among the individual amplifiers 7a through 7d in a similar manner.

Sixth Embodiment

Figure 14:
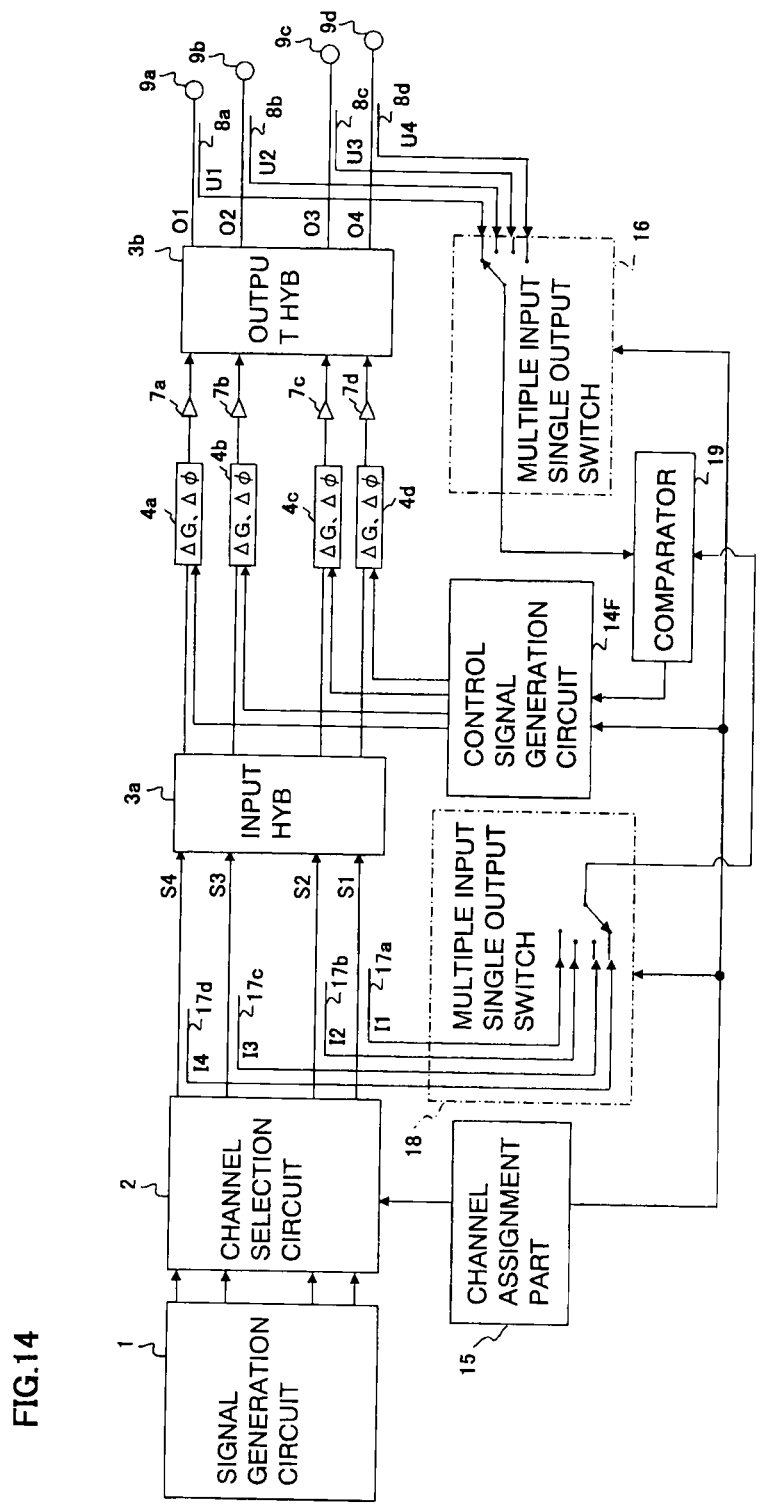
FIG. 14 is a block diagram showing the arrangement of a multiport amplifier according to a sixth embodiment of the present invention. (Sixth Embodiment)
Figure 15:
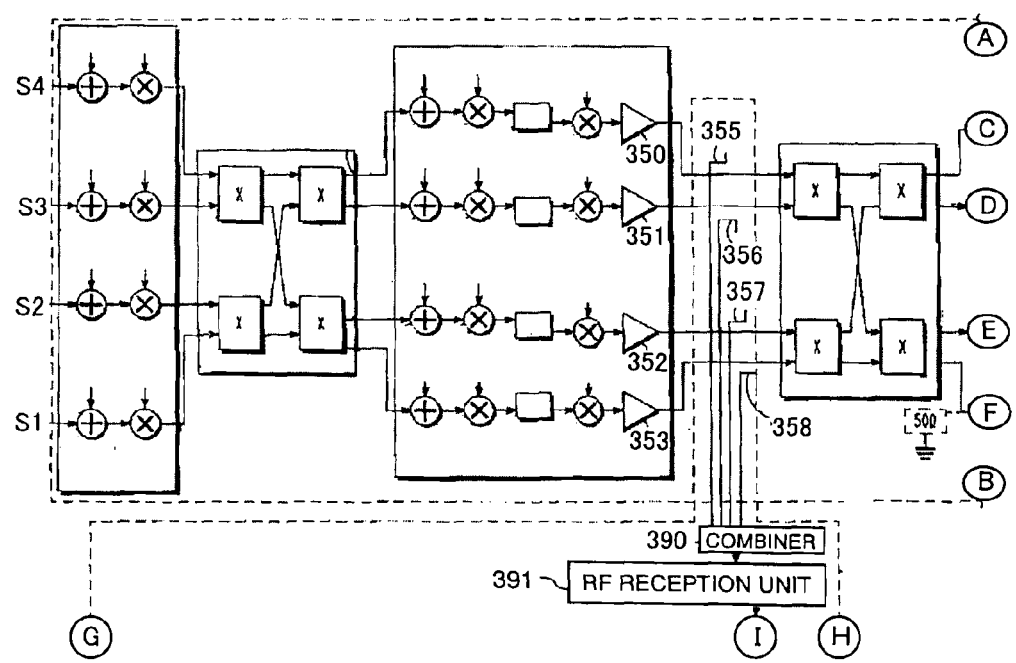
FIG. 15 is a block diagram showing the arrangement of a conventional multiport amplifier.
Figure 16:
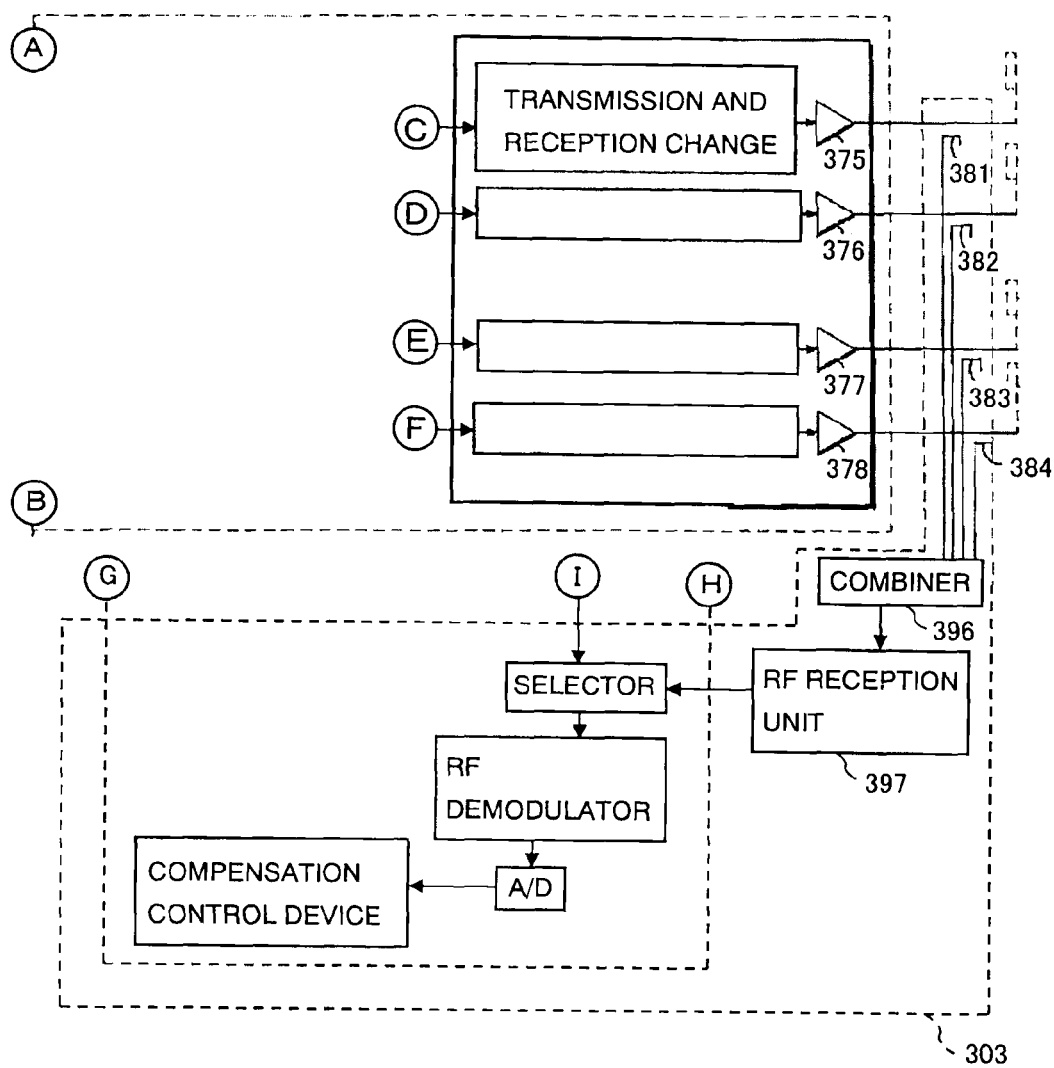
FIG. 16 is a block diagram showing the arrangement of the conventional multiport amplifier.

Although in the above-mentioned fifth embodiment (FIG. 10), the output signal of the multiple input single output switch 16 is directly inputted to a control signal generation circuit 14E, it may be inputted to the control signal generation circuit 14F through a comparator 19, as shown in FIG. 14.

FIG. 14 is a block diagram showing the arrangement of a multiport amplifier according to a sixth embodiment of the present invention, wherein those components which are similar to the above-mentioned one (see FIG. 10) are denoted by the same reference numerals and characters as those in the above-mentioned embodiment, or with "F" being attached to reference numerals, and a detailed description thereof is omitted.

In this case, similarly as stated above, the multiport amplifier having an error compensation circuit with the number of ports being four is shown.

In FIG. 14, the multiport amplifier is provided with, in addition to the multiple input single output switch 16, input coupling circuits 17a through 17d, a second multiple input single output switch 18 (hereinafter referred to simply as "the multiple input single output switch 18"), and a comparator 19.

The multiple input single output switch 18 and the comparator 19 constitute a feedback circuit, together with the multiple input single output switch 16 and the control signal generation circuit 14F.

The input coupling circuits 17a through 17d extract a part of the input signals S1 through S4 as input extraction signals I1 through I4, and the multiple input single output switch 18 inputs either of the plurality of input extraction signals I1 through I4 to the comparator 19.

The comparator 19 makes a comparison between an output extraction signal through the multiple input single output switch 16 and an input extraction signal through the multiple input single output switch 18, and extracts unnecessary frequency components (unnecessary or undesired signals) included in the plurality of output signals O1 through O4.

Next, reference will be made to an operation according to this sixth embodiment of the present invention as shown in FIG. 14.

Here, note that the basic operation according to the sixth embodiment of the present invention, being the same as that of the above-mentioned fifth embodiment, is omitted, and an operation to deal with an isolation deterioration problem different from the above-mentioned will be explained.

First, the output coupling circuits 8a through 8d extract a part of the output signals O1 through O4 as output extraction signals U1 through U4, respectively, and input them to the comparator 19 through the multiple input single output switch 16.

At this time, a signal to be inputted to the comparator 19 among the output extraction signals U1 through U4 is controlled by the multiple input single output switch 16 under the control of the channel assignment part 15. That is, whether which of the output extraction signals U1 through U4 is to be passed is decided based on a signal inputted to the multiple input single output switch 16 from the channel assignment part 15.

In addition, the input coupling circuits 17a through 17d extract a part of the input signals S1 through S4 as the input extraction signals I1 through I4, respectively, and input them to the comparator 19 through the multiple input single output switch 18.

At this time, a signal to be inputted to the comparator 19 among the input extraction signals I1 through I4 is controlled by the multiple input single output switch 18 under the control of the channel assignment part 15. That is, whether which of the input extraction signals I1 through I4 is to be passed is decided based on a signal inputted to the multiple input single output switch 18 from the channel assignment part 15.

The comparator 19 extracts unnecessary frequency components (unnecessary or undesired signals) included in the output signals O1 through O4 by making a correlation between the output extraction signals U1 through U4 and the input extraction signals I1 through I4.

For example, in the case of only the input signal S1, the comparator 19 can obtain amplitude information of the undesired signals included in the output signals O1 through O3 by making a correlation between the input extraction signal I1 and the output extraction signals U1 through U3.

Here, note that in the comparator 19, whether to make a correlation between the input extraction signal I1 and the output extraction signal U1, or whether to make a correlation between the input extraction signal I1 and the output extraction signal U2, or whether to make a correlation between the input extraction signal I1 and the output extraction signal U3, can be selected by controlling the multiple input single output switches 16, 18.

In addition, here, description has been made on the case of only the input signal S1, but in the case of the input signals S2 through S4, too, it is possible to obtain amplitude information of undesired signals in a similar manner.

In this manner, by acquiring the input extraction signals I1 through I4 from the input coupling circuits 17a through 17d, in cases where all the input signals S1 through S4 are inputted, too, it is possible to obtain the amplitude information of undesired signals (output signals including unnecessary frequency components) under the control of the multiple input single output switches 16, 18.

The undesired signals obtained in this manner can be minimized in their passing amounts (i.e., maximized in isolation), similar to the above-mentioned fifth embodiment, by changing the amplitude and phase of at least one gain and phase control circuit among the gain and phase control circuits 4a through 4d.

That is, an amplitude and a phase of the gain and phase control circuit, which maximize isolation, can be obtained, similarly as stated above, so it is possible to obtain the relation between the amplitude difference Gi and the phase difference φi of the amplifiers 7a through 7d.

As described above, the multiport amplifier according to the sixth embodiment (FIG. 14) of the present invention is provided with the plurality of input coupling circuits 17a through 17d that receive the input extraction signals I1 through I4 corresponding to the plurality of input signals S1 through S4, respectively, and the feedback circuit includes the multiple input single output switch 18 that is connected to the plurality of input coupling circuits 17a through 17d, and the comparator 19 that is connected to the multiple input single output switches 16, 18.

The comparator 19 makes a comparison between an output extraction signal through the multiple input single output switch 16 and an input extraction signal through the multiple input single output switch 18, and extracts unnecessary frequency components included in the plurality of output signals O1 through O4.

According to this, the amplitude differences and the phase differences among the individual amplifiers 7a through 7d can be compensated for, and hence the quality of communication is improved.

In addition, the control signal generation circuit 14F calculates the control signals for the plurality of gain and phase control circuits 4a through 4d based only on the amplitude information of the plurality of output signals O1 through O4 to which undesired signals are outputted, so it is possible to achieve the multiport amplifier with a simple structure or arrangement.

Note that the case where the port number of the amplifiers 7a through 7d is four has been shown herein, but in the case of any number thereof equal to or greater than two, too, it is possible to compensate for the amplitude difference and the phase difference of each amplifier in a similar manner.

In addition, even in a state where the input signals S1 through S4 are all inputted, it is possible to obtain the amplitude information of undesired signals in a similar manner, as a result of which it is possible to compensate for the amplitude difference and the phase difference of each of the amplifiers 7a through 7d without stopping the operation of the multiport amplifier.

The invention claimed is:

1. A multiport amplifier comprising:
an input hybrid to which a plurality of input signals corresponding to a plurality of channels are inputted, said input signals each having a necessary component at a desired frequency of a respective channel;
an output hybrid which outputs a plurality of output signals corresponding to said plurality of input signals from a plurality of output terminals;
a plurality of amplifiers and a plurality of gain and phase control circuits which are inserted between said input hybrid and said output hybrid, wherein said plurality of amplifiers are combined in parallel with one another;
a plurality of output coupling circuits that are inserted between said output hybrid and said plurality of output terminals so that they receive output extraction signals corresponding to said plurality of output signals; and
a feedback circuit that is inserted between said plurality of output coupling circuits and said plurality of gain and phase control circuits;

wherein said feedback circuit includes,
at least one frequency selection circuit configured to pass only unnecessary frequency components other than each necessary component at said desired frequency,
a control signal generation circuit configured to generate a control signal for controlling a gain and a phase in at least one of said plurality of gain and phase control circuits, and
said control signal generation circuit generates control signals for said plurality of gain and phase control circuits based on presence of unnecessary frequency components included in said plurality of output signals so as to attenuate said unnecessary frequency components.

2. The multiport amplifier as set forth in claim 1, wherein the frequency selection circuit includes a band stop filter.

3. The multiport amplifier as set forth in claim 1, wherein
one of said input hybrid and said plurality of gain and phase control circuits includes a digital circuit; and
provision is made for DA converters and frequency converters that are inserted between said input hybrid and said output hybrid.

4. The multiport amplifier as set forth in claim 3, wherein said feedback circuit includes a frequency converter and an AD converter.

5. A wireless device comprising a plurality of multiport amplifiers that are arranged in parallel to each other, each of said multiport amplifiers being set forth in claim 1.

6. The wireless device as set forth in claim 5, further comprising:
an input signal gain and phase control circuit that are connected to the feedback circuit provided in each of said plurality of multiport amplifiers,
wherein in each of said plurality of multiport amplifiers, the output extraction signals received from said plurality of output coupling circuits are separated into two signals by the frequency selection circuit in said feedback circuit, and one of said two signals thus separated is inputted to the control signal generation circuit in said feedback circuit, and the other of said two signals is inputted to said input signal gain and phase control circuit.

* * * * *